United States Patent
Barr et al.

(10) Patent No.: US 11,778,896 B2
(45) Date of Patent: Oct. 3, 2023

(54) VISIBLY TRANSPARENT, NEAR-INFRARED-ABSORBING METAL-COMPLEX PHOTOVOLTAIC DEVICES

(71) Applicant: Ubiquitous Energy, Inc., Redwood City, CA (US)

(72) Inventors: Miles Barr, Redwood City, CA (US); Richa Pandey, Santa Clara, CA (US); Bo He, Albany, CA (US)

(73) Assignee: Ubiquitous Energy, Inc., Redwood City, CA (US)

( * ) Notice: Subject to any disclaimer, the term of this patent is extended or adjusted under 35 U.S.C. 154(b) by 0 days.

(21) Appl. No.: 16/010,369

(22) Filed: Jun. 15, 2018

(65) Prior Publication Data

US 2018/0366659 A1    Dec. 20, 2018

Related U.S. Application Data

(60) Provisional application No. 62/521,158, filed on Jun. 16, 2017.

(51) Int. Cl.
    *H10K 85/30*    (2023.01)
    *H10K 30/20*    (2023.01)
    (Continued)

(52) U.S. Cl.
    CPC ......... *H10K 85/331* (2023.02); *C07F 15/045* (2013.01); *H10K 85/361* (2023.02);
    (Continued)

(58) Field of Classification Search
    CPC . H01L 51/0083; H01L 51/009; H01L 51/424; H01L 51/001; H01L 51/442;
    (Continued)

(56) References Cited

U.S. PATENT DOCUMENTS

| | | | | |
|---|---|---|---|---|
| 4,152,332 A | * | 5/1979 | Bloom | C07D 333/22 548/403 |
| 5,182,409 A | * | 1/1993 | Takuma | C07C 321/10 556/138 |

(Continued)

FOREIGN PATENT DOCUMENTS

| | | |
|---|---|---|
| CN | 101407574 A | 4/2009 |
| CN | 101548404 A | 9/2009 |

(Continued)

OTHER PUBLICATIONS

Qingqing Miao "Syntheses and characterization of several nickel bis(dithiolene) complexes with strong and broad Near-IR absorption" Inorganica Chimica Acta 376 (2011) 619-627 (Year: 2011).*

(Continued)

*Primary Examiner* — Michael Y Sun
(74) *Attorney, Agent, or Firm* — Kilpatrick Townsend & Stockton LLP

(57) ABSTRACT

Visibly transparent photovoltaic devices are disclosed, such as those are transparent to visible light but absorb near-infrared light and/or ultraviolet light. The photovoltaic devices make use of transparent electrodes and near-infrared absorbing visibly transparent photoactive compounds, optical materials, and/or buffer materials.

21 Claims, 11 Drawing Sheets

(51) Int. Cl.
*C07F 15/04* (2006.01)
*H10K 30/82* (2023.01)
*H10K 71/16* (2023.01)
*H10K 71/00* (2023.01)
*H01L 31/076* (2012.01)

(52) U.S. Cl.
CPC ............ *H01L 31/076* (2013.01); *H10K 30/20* (2023.02); *H10K 30/82* (2023.02); *H10K 71/164* (2023.02); *H10K 71/311* (2023.02); *H10K 85/30* (2023.02); *H10K 85/341* (2023.02); *H10K 85/342* (2023.02); *H10K 85/344* (2023.02); *H10K 85/346* (2023.02); *H10K 85/348* (2023.02); *H10K 85/351* (2023.02)

(58) Field of Classification Search
CPC ......... H01L 51/0025; H01L 51/002533; H01L 31/076; C07F 15/045; H10K 85/331; H10K 85/361; H10K 30/20; H10K 30/82; H10K 71/164; H10K 71/311; H10K 85/30; H10K 85/341; H10K 85/342; H10K 85/344; H10K 85/346; H10K 85/348; H10K 85/351; Y02E 10/549; Y02P 70/50
See application file for complete search history.

(56) References Cited

U.S. PATENT DOCUMENTS

| | | |
|---|---|---|
| 6,120,692 A | 9/2000 | Wang et al. |
| 9,728,735 B2 | 8/2017 | Bulovic et al. |
| 9,985,158 B2 | 5/2018 | Lunt et al. |
| 10,403,774 B2 | 9/2019 | Barr et al. |
| 2006/0257760 A1 | 11/2006 | Mori et al. |
| 2007/0219375 A1 | 9/2007 | Fujiyama et al. |
| 2009/0047596 A1 | 2/2009 | Felder et al. |
| 2009/0292130 A1 | 11/2009 | Shi et al. |
| 2009/0308458 A1 | 12/2009 | Aramaki et al. |
| 2012/0186623 A1 | 7/2012 | Bulovic et al. |
| 2013/0087740 A1 | 4/2013 | Widzinski et al. |
| 2013/0104968 A1* | 5/2013 | Pfeiffer ............ H01L 31/035272 136/255 |
| 2014/0084266 A1 | 3/2014 | Yang et al. |
| 2014/0190550 A1* | 7/2014 | Loh ........................ H01L 27/302 136/244 |
| 2014/0318609 A1* | 10/2014 | Martorell Pena ... H01L 51/4213 136/255 |
| 2015/0270501 A1 | 9/2015 | Thompson et al. |
| 2015/0340634 A1* | 11/2015 | Forrest ................ H01L 51/4253 136/255 |
| 2016/0141497 A1 | 5/2016 | Weiss et al. |
| 2016/0248021 A1 | 8/2016 | Sundarraj et al. |
| 2017/0005284 A1 | 1/2017 | Che et al. |
| 2018/0040840 A1* | 2/2018 | Hayakawa ............ H01L 51/442 |
| 2018/0138344 A1 | 5/2018 | Barr et al. |
| 2018/0366648 A1 | 12/2018 | Barr et al. |
| 2018/0366654 A1 | 12/2018 | Barr et al. |
| 2018/0366658 A1 | 12/2018 | Barr et al. |
| 2018/0366667 A1 | 12/2018 | Barr et al. |
| 2018/0366668 A1 | 12/2018 | Barr et al. |
| 2019/0036480 A1 | 1/2019 | Barr et al. |

FOREIGN PATENT DOCUMENTS

| | | |
|---|---|---|
| CN | 102884629 A | 1/2013 |
| CN | 103534831 A | 1/2014 |
| CN | 104904028 A | 9/2015 |
| CN | 105409020 A | 3/2016 |
| CN | 105493306 A | 4/2016 |
| CN | 105849931 A | 8/2016 |
| DE | 102011013897 A1 | 9/2012 |
| EP | 2838095 | 2/2015 |
| JP | H07133475 A1 * | 11/1993 |
| JP | 2003139946 A * | 5/2003 |
| JP | 2004069952 A * | 3/2004 |
| JP | 2010006766 A | 1/2010 |
| JP | 2010219356 A * | 9/2010 |
| JP | 2013103911 A | 5/2013 |
| JP | 2014505370 A | 2/2014 |
| JP | 2016518714 A | 6/2016 |
| JP | 2016146408 A | 8/2016 |
| JP | 2016175868 A | 10/2016 |
| KR | 20130038204 A | 4/2013 |
| KR | 20140021542 A | 2/2014 |
| KR | 20160045854 A | 4/2016 |
| KR | 20160047487 A | 5/2016 |
| WO | 2014026244 A1 | 2/2014 |
| WO | 2017191466 A1 | 11/2017 |

OTHER PUBLICATIONS

Nikolai Elfers "Singlet Fission in Quinoidal Oligothiophenes" J. Phys. Chem. C 2016, 120, 13901-13910 (Year: 2016).*
Fabio Silvestri "Efficient Squaraine-Based Solution Processable Bulk-Heterojunction Solar Cells" J. Am. Chem. Soc. 2008, 130, 17640-17641 (Year: 2008).*
Walaa Elsawy "Isoindigo-based small molecules for high-performance solution-processed organic photovoltaic devices: the electron donating effect of the donor group on photo-physical properties and device performance" Phys.Chem. Chem. Phys., 2013, 15, 15193 (Year: 2013).*
Alibert-Fouet, et al., "Liquid-Crystalline and Electron-Deficient Coronene Oligocarboxylic Esters and Imides By Twofold Benzogenic Diels-Alder Reactions on Perylenes", Chemistry a European Journal, vol. 13, No. 6, 2007, pp. 1746-1753.
Bandi, et al., "Ultrafast Photoinduced Electron Transfer and Charge Stabilization in Donor-Acceptor Dyads Capable of Harvesting Near-Infrared Light", Chemistry—A European Journal, vol. 21, No. 32, Jun. 30, 2015, 11483-11494.
Brinkmann, et al., "Fluorinated Phthalocyanines as Molecular Semiconductor Thin Films", Physica. Status Solidi (A) Applications and Materials, vol. 205, No. 3, Mar. 2008, pp. 409-420.
Cammidge, et al., "Mixed Cyclisations Giving Phthalocyanine-Naphthalocyanine Hybrids", Tetrahedron Letters, vol. 50, No. 25, Jun. 2009, pp. 3013-3016.
Ding, et al., "Polycyclic Imide Derivatives: Synthesis and Effective Tuning of Lowest Unoccupied Molecular Orbital Levels through Molecular Engineering", Organic Letters, vol. 12, No. 23, Dec. 3, 2010, pp. 5522-5525.
Falkenberg, "Optimizing Organic Solar Cells—Transparent Electron Transport Materials for Improving the Device Performance", Ph.D. Dissertation, Technische Universitat Dresden, 2011, 153 pages.
Gommans, et al., "Perfluorinated Subphthalocyanine as a New Acceptor Material in a Small-Molecule Bilayer Organic Solar Cell", Advanced Functional Materials, vol. 19, No. 21, Nov. 9, 2009, pp. 3435-3439.
Gresser, et al., "Synthesis and Characterization of Near-Infrared Absorbing Benzannulated Aza-BODIPY Dyes", Chemistry A European Journal, vol. 17, No. 10, 2011, 2939-2947.
Hanack, et al., "Conducting Stacked Met Allophthalocy Anines And Related Compounds", Advanced Materials vol. 6, No. 11, Nov. 1994, pp. 819-833.
Lim, et al., "Silicon-Naphthalo/Phthalocyanine-Hybrid Sensitizer for Efficient Red Response in Dye-Sensitized Solar Cells", Organic Letters, vol. 15, No. 4, Feb. 5, 2013, pp. 784-787.
Lin, et al., "An Electron Acceptor Challenging Fullerenes for Efficient Polymer Solar Cells", Advanced Materials, vol. 27, No. 7, Jan. 2015, pp. 1170-1174.
Lunt, et al., "Transparent, Near-Infrared Organic Photovoltaic Solar Cells for Window and Energy-Scavenging Applications", Applied Physics Letters, vol. 98, No. 11, Mar. 17, 2011, pp. 113305-1-113305-3.
Mahadevegowda, et al., "Amphiphilic Corannulene Derivatives: Synthetic Access and Development of a Structure/Property Rela-

(56) References Cited

OTHER PUBLICATIONS tionship in Thermoresponsive Buckybowl Amphiphiles", ACS Omega, vol. 2, No. 8, Aug. 25, 2017, pp. 4964-4971.
Margaron, et al., "Photodynamic Properties of Naphthosulfobenzoporphyrazines, Novel Asymmetric, Amphiphilic Phthalocyanine Derivatives", Journal of Photochemistry and Photobiology, vol. 14, No. 3, Jul. 1992, pp. 187-199.
Marshall, et al., "Transition Metal Dithiolene Near-IR Dyes and Their Applications in Liquid Crystal Devices", LLE Review, vol. 106, Jan.-Mar. 2006, pp. 112-128.
McKeown, "Phthalocyanine-containing Polymers", Journal of Materials Chemistry, vol. 10, No. 9, Jan. 28, 2000, pp. 1979-1995.
Meiss, et al., "Near-Infrared Absorbing Semitransparent Organic Solar Cells", Applied Physics Letters, vol. 99, No. 19, Nov. 11, 2011, pp. 193307-1-193307-3.
Nielsen, et al., "Non-Fullerene Electron Acceptors for Use in Organic Solar Cells", Accounts of Chemical Research, vol. 48, No. 11, Oct. 27, 2015, pp. 2803-2812.
PCT/US2018/037923, "International Search Report and Written Opinion", dated Oct. 24, 2018, 13 pages.
Peisert, et al., "Fluorination of Copper Phthalocyanines: Electronic Structure and Interface Properties", Journal of Applied Physics, vol. 93, No. 12, Jun. 15, 2003, pp. 9683-9692.
Roger, et al., "Core-Tetrasubstituted Naphthalene Diimides: Synthesis, Optical Properties, and Redox Characteristics", J. Org. Chem., vol. 72, No. 21, Sep. 21, 2007, pp. 8070-8075.
Schellhammer, et al., "Tuning Near-Infrared Absorbing Donor Materials: A Study of Electronic, Optical, and Charge-Transport Properties of aza-BODIPYs", Chemistry of Materials, vol. 29, No. 13, Jun. 12, 2017, pp. 5525-5536.
Shang, et al., "A Triphenylamine-Containing Donor-Acceptor Molecule for Stable, Reversible, Ultrahigh Density Data Storage", J. Am. Chem. Soc., vol. 129, No. 38, Sep. 26, 2007, pp. 11674-11675.
Shenoy, et al., "Disperse Dyes Derived from 3-Oxo-2,3-Dihydrobenzo [itb]Thiophene-1,1-Dioxide and 3-Dicyanomethylene-2,3-Dihydrobenzo [itb] Thiophene-1,1-Dioxide", Dyes and Pigments, vol. 11, No. 1, Dec. 1989, pp. 37-46.
Song, et al., "Phthalocyanato Tin(IV) Dichloride: An Air-Stable, High-Performance, n-Type Organic Semiconductor with a High Field-Effect Electron Mobility", Advanced Materials, vol. 20, No. 11, Jun. 4, 2008, pp. 2142-2144.
Sullivan, et al., "Halogenated Boron Subphthalocyanines as Light Harvesting Electron Acceptors in Organic Photovoltaics", Advanced Energy Materials, vol. 1, No. 3, Mar. 30, 2011, pp. 352-355.
Tan, et al., "Starburst Triphenylamine-Based Donor-Acceptor-Type Small Molecules for Solution-Processed Organic Solar Cells", European Journal of Organic Chemistry, vol. 7, 2016, pp. 799-805.
Verreet, et al., "A 4% Efficient Organic Solar Cell Using a Fluorinated Fused Subphthalocyanine Dimer as an Electron Acceptor", Advanced Energy Materials, vol. 1, No. 4, Jul. 2011, pp. 565-568.
Walter, et al., "Porphyrins and Phthalocyanines in Solar Photovoltaic Cells", Journal of Porphyrins and Phthalocyanines, vol. 14, No. 9, 2010, pp. 759-792.
Wu, et al., "β-Thiophene-Fused BF2-Azadipyrromethenes as Near-Infrared Dyes", Organic Letters, vol. 16, No. 3, Feb. 7, 2014, pp. 748-751.
Young, et al., "Angle Dependence of Transparent Photovoltaics in Conventional and Optically Inverted Configurations", Applied Physics Letters, vol. 103, No. 13, Sep. 25, 2013, pp. 133304-1-133304-5.
Zhao, et al., "Fullerene-Free Polymer Solar Cells with Over 11% Efficiency and Excellent Thermal Stability", Advanced Materials, vol. 28, No. 23, Jun. 2016, 4734-4739.
Zhao, et al., "Molecular Optimization Enables over 13% Efficiency in Organic Solar Cells", Journal of the American Chemical Society, vol. 139, No. 21, May 17, 2017, pp. 7148-7151.
Veldman, et al., "Photoinduced Charge And Energy Transfer In Dye-Doped Conjugated Polymers", Thin Solid Films, vols. 511-512, Jul. 26, 2006, pp. 581-586.
U.S. Appl. No. 16/010,371, filed Jun. 15, 2018, US-2018-0366648-A1, Dec. 20, 2018.

U.S. Appl. No. 16/010,364, filed Jun. 15, 2018, US-2018-0366668-A1, Dec. 20, 2018.
U.S. Appl. No. 16/010,342, filed Jun. 15, 2018, US-2018-0366667-A1, Dec. 20, 2018.
U.S. Appl. No. 16/010,374, filed Jun. 15, 2018, US-2018-0366654-A1, Dec. 20, 2018.
U.S. Appl. No. 16/010,365, filed Jun. 15, 2018, US-2018-0366658-A1, Dec. 20, 2018.
AU2018283407, "First Examination Report", dated Sep. 8, 2020, 4 pages.
AU2018283407, "Second Examination Report", dated Oct. 28, 2020, 4 pages.
KR10-2020-7000947, "Office Action", dated Nov. 18, 2020, 15 pages.
Wilken, et al., "Semitransparent Polymer-Based Solar Cells with Aluminum-Doped Zinc Oxide Electrodes", American Chemical Society Applied Materials & Interfaces, vol. 7, Issue 1, 2015, pp. 287-300.
KR10-2020-7000947, "Notice of Decision to Grant", dated Mar. 5, 2021, 5 pages.
EP18818288.5, "Extended European Search Report", dated Feb. 12, 2021, 10 pages.
Liu, et al., "Efficient Semitransparent Solar Cells with High NIR Responsiveness Enabled by a Small-Bandgap Electron Acceptor", Advanced Materials, vol. 29, No. 21, Jun. 2017, 7 pages.
Liu, et al., "Naphthalene Substituents Bonded via the β-position: an Extended Conjugated Moiety Can Achieve a Decent Trade-off Between Optical Band Gap and Open Circuit Voltage in Symmetry-breaking Benzodithiophene-based Polymer Solar Cells", Journal of Materials Chemistry A, vol. 5, No. 19, 2013, 8 pages.
Lu, et al., "Synthesis And Spectroscopic Properties of Fused-Ring-Expanded Aza-Boradiazaindacenes", Chemistry: An Asian Journal. vol. 6, Issue 4, Apr. 4, 2011, pp. 1026-1037.
Yao, et al., "Achieving Highly Efficient Nonfullerene Organic Solar Cells with Improved Intermolecular Interaction and Open-Circuit Voltage", Advanced Materials, vol. 29, No. 21, Jun. 2017, 6 pages.
Cao, et al., "Synthesis and Optical Properties of Axially Bromo-Substituted Subphthalocyanines", Dyes and Pigments, vol. 54, Issue 3, Sep. 2002, pp. 213-219.
Elfers, et al., "Singlet Fission in Quinoidal Oligothiophenes", The Journal of Physical Chemistry C, vol. 120, No. 26, Jun. 2016, pp. 13901-13910.
Jakubikova, et al., "Effects of Peripheral and Axial Substitutions on Electronic Transitions of Tin Naphthalocyanines", The Journal of Physical Chemistry A, vol. 115, Aug. 1, 2011, pp. 9265-9272.
Mikroyannidis, et al., "Low Band Gap Conjugated Small Molecules Containing Benzobisthiadiazole and Thienothiadiazole Central Units: Synthesis and Application for Bulk Heterojunction Solar Cells", Journal of Materials Chemistry; vol. 21, 2011, pp. 4679-4688.
Montero-Campillo, et al., "UV/V is Spectra of Subporphyrazines and Subphthalocyanines with Aluminum and Gallium: A Time-Dependent DFT Study", ChemPhysChem, vol. 14, 2013, pp. 915-922.
Tu, et al., "Synthesis And Spectral Properties of Axially Bromo-Substituted Subphthalocyanines for Optical Storage", Fifth International Symposium on Optical Storage, Feb. 7, 2001, pp. 176-180.
Yang, "Theoretical Study of Experimentally Unknown Metallosubphthalocyanines", Chemical Physics Letters vol. 511, Issues 1-3, Jul. 26, 2011, pp. 51-56.
Zdravkovski, et al., "A Comparison of Structural and Electronic Characteristics among Subphthalocyanine and Phthalocyanine Complexes", Journal of Molecular Structure: Theochem, vol. 717, No. 1, Mar. 2005, pp. 85-89.
Zotti, et al., "Magnetic and Conductive Properties of Quinoidal Oligothiophenes", Chemistry of materials, vol. 18, Issue 6, Feb. 17, 2006, pp. 1539-1545.
JP2019-569755, "Office Action", dated May 13, 2022, 14 pages.
CN2018800497063, "Office Action", dated Apr. 25, 2022, 13 pages.
Mueller, et al., "Organic Solar Cells Based on a Novel Infrared Absorbing Aza-Bodipy Dye", Solar Energy Materials & Solar Cells 99, 2012, pp. 176-181.

(56) References Cited

OTHER PUBLICATIONS

Cai, et al., "Large Hydroazaacene Diimides: Synthesis, Tautomerism, Halochromism, And Redox-Switchable NIR Optics", Chemical Science, vol. 3, No. 11, Oct. 1, 2012.
Guo, et al., "Imide- and Amide-Functionalized Polymer Semiconductors", Chemical Reviews, vol. 114, No. 18, Sep. 2, 2014, pp. 8943-9021.
Stauffer, "Transparent Solar Cells: Generating Power from Everyday Surfaces", Energy Futures, MIT Energy Initiative, Spring, Available Online at: http://energy.mit.edu/news/transparent-solar-cells/, Jun. 20, 2013, pp. 1-7.
CN201880049706.3, "Office Action", dated Feb. 13, 2023, 8 pages.
KR10-2022-7026207, "Office Action", dated Dec. 9, 2022, 10 pages.
JP2019-569755, "Office Action", dated Dec. 5, 2022, 10 pages.
Momeni, et al., "A Local CC2 and TDA-DFT Double Hybrid Study on BODIPY/aza—BODIPY Dimers as Heavy Atom Free Triplet Photosensitizers for Photodynamic Therapy Applications", The Journal of Physical Chemistry A, vol. 120, 2016, pp. 2550-2560.
Nakamura, et al., "Π-Fused Bis-BODIPY as a Candidate for NIR Dyes", Organic & Biomolecular Chemistry, vol. 10, 2012, pp. 6840-6849.
EP18818288.5, "Office Action", dated Apr. 26, 2023, 6 pages.
Shin, et al., "Exciton Diffusion in Near-infrared Absorbing Solution-processed Organic Thin Films", Physical Chemistry Chemical Physics, vol. 15, No. 8, Jan. 1, 2013, pp. 2867-2872.
CN201880049706.3, "Office Action", dated May 19, 2023, 6 pages.
KR10-2022-7026207, "Office Action", dated Jun. 19, 2023, 3 pages.

\* cited by examiner

VISIBLY TRANSPARENT, NEAR-INFRARED-ABSORBING METAL-COMPLEX PHOTOVOLTAIC DEVICES

CROSS-REFERENCE TO RELATED APPLICATIONS

This application claims the benefit of and priority to U.S. Provisional Application No. 62/521,158, filed on Jun. 16, 2017, which is hereby incorporated by reference in its entirety.

FIELD

This application relates generally to the field of optically active materials and devices, and, more particularly, to visibly transparent photovoltaic devices and materials for visibly transparent photovoltaic devices.

BACKGROUND

The surface area necessary to take advantage of solar energy remains an obstacle to offsetting a significant portion of non-renewable energy consumption. For this reason, low-cost, transparent, organic photovoltaic (OPV) devices that can be integrated onto window panes in homes, skyscrapers, and automobiles are desirable. For example, window glass utilized in automobiles and architecture are typically 70-80% and 55-90% transmissive, respectively, to the visible spectrum, e.g., light with wavelengths from about 450 to 650 nanometers (nm). The limited mechanical flexibility, high module cost and, more importantly, the band-like absorption of inorganic semiconductors limit their potential utility to transparent solar cells.

In contrast, the optical characteristics of organic and molecular semiconductors results in absorption spectra that are highly structured with absorption minima and maxima that are uniquely distinct from the band absorption of their inorganic counterparts. However, a variety of organic and molecular semiconductors exist, but many of exhibit strong absorption in the visible spectrum and thus are not optimal for use in window glass-based photovoltaics.

SUMMARY

Described herein are materials, methods, and systems related to visibly transparent photovoltaic devices. More particularly, the present description provides metal dithiolate compounds and methods and systems incorporating the materials and compounds as a photoactive material of a visibly transparent photovoltaic device. Embodiments of the present invention provide transparent photoactive materials, including organic semiconductor materials, useful in visibly transparent photovoltaic devices. The invention is applicable to a variety of applications in photovoltaics and electronics.

Materials, methods, and system for transparent photovoltaic devices are disclosed, such as those that are transparent to visible light but absorb near-infrared light and/or ultraviolet light. The photovoltaic devices make use of transparent electrodes and visibly transparent metal dithiolate compounds, which may be useful as photoactive materials, buffer materials, and/or optical layers, for example. In embodiments, the disclosed visibly transparent photoactive compounds exhibit a maximum near-infrared absorption strength and a maximum visible absorption strength, wherein the maximum near-infrared absorption strength is greater than the maximum visible absorption strength.

Numerous benefits are achieved by way of the present invention over conventional techniques. For example, embodiments of the present invention provide methods and systems for absorbing near-infrared and/or ultraviolet radiation for photovoltaic power generation while being transparent to visible light. Advantageously, these optical characteristics provide for the ability to generate electricity from incident solar radiation in a photovoltaic device, while still allowing useful visible light to be passed through, permitting a viewer to see through the photovoltaic device.

In addition, the photoactive compounds described herein provide suitable electron donor and/or electron acceptors for generation and separation of electron-hole pairs via absorption of light in order to provide a DC voltage or current to an external circuit. Advantageously, the disclosed photoactive compounds include those that are transparent to visible light or absorb only relatively small amounts of light in the visible band, such as between about 450 and about 650 nm, while exhibiting a greater absorption strength in the near-infrared (NIR) band, such as between about 650 nm and about 1400 nm. In some embodiments, the disclosed photoactive compounds exhibit a peak absorption in the NIR band. In some embodiments, the disclosed photoactive compounds exhibit an absorption in the visible band having a strength less than that in the NIR band.

The disclosed photoactive compounds exhibit materials properties providing advantages for manufacturing and performance of visibly transparent photovoltaic devices as well. For example, devices including photoactive compounds described herein may be manufactured using techniques in which the photoactive compound is applied to a substrate using vacuum deposition techniques rather than a solution-based application technique. Use of vacuum deposition techniques may advantageously allow high purity photoactive layers to be generated, improving device efficiency and performance and reducing manufacturing complexity. For example, transparent photovoltaic devices may incorporate the disclosed photoactive compounds into active material layers by way of vacuum thermal evaporation techniques, eliminating use of solution based photoactive material application steps and associated waste product handling and disposal. Further, in some embodiments, the disclosed photoactive compounds may be purified by an evaporation and/or sublimation technique. Purification by evaporation and/or sublimation may be useful for generating high purity photoactive materials and compounds, which may, in turn, allow improved transparent photovoltaic device production and performance.

A visibly transparent photovoltaic device may comprise a visibly transparent substrate; a first visibly transparent electrode coupled to the visibly transparent substrate; a second visibly transparent electrode above the first visibly transparent electrode; a first visibly transparent active layer between the first visibly transparent electrode and the second visibly transparent electrode, wherein the first visibly transparent photoactive layer comprises a visibly transparent photoactive compound, such as any visibly transparent photoactive compound described herein, including a visibly transparent photoactive compound that exhibits a first maximum near-infrared absorption strength and a first maximum visible absorption strength, such as a first maximum near-infrared absorption strength that is greater than the first maximum visible absorption strength; a second visibly transparent photoactive layer between the first visibly transparent electrode and the second visibly transparent electrode and exhibiting a second maximum absorption strength in the near-infrared or ultraviolet and a second maximum visible absorption strength, such as a second maximum absorption strength that is greater than the second maximum visible absorption strength. Optionally, visibly transparent photovoltaic devices may further comprise a first buffer layer disposed between the first visibly transparent electrode and the first visibly transparent active layer. Optionally, visibly transparent photovoltaic devices may further comprise a second buffer layer disposed between the second visibly transparent active layer and the second visibly transparent electrode.

Optionally, the first visibly transparent photoactive layer is coupled to the first visibly transparent electrode. Optionally, the first visibly transparent photoactive layer is coupled to the second visibly transparent electrode. Optionally, the second visibly transparent photoactive layer is coupled to the first visibly transparent electrode. Optionally, the second visibly transparent photoactive layer is coupled to the second visibly transparent electrode. As used herein, two objects or layers being coupled refers to the condition where the two objects or layers are directly coupled (i.e., in physical contact) or indirectly coupled, such as with one or more additional objects or layers between them. Coupling of objects or layers may indicate that the objects or layers are part of a single overall structure or device.

Optionally, the photoactive compound functions as an electron acceptor material. In some embodiments, when the photoactive compound functions as an electron acceptor material, the second visibly transparent photoactive layer may include an electron donor material. Optionally, the photoactive compound functions as an electron donor material. In embodiments, when the photoactive compound functions as an electron donor material, the second visibly transparent photoactive layer may include an electron acceptor material.

Various configurations are contemplated for the photoactive layers. For example, the first visibly transparent photoactive layer and the second visibly transparent photoactive layer may each independently have thicknesses of 1 nm to 300 nm, such as about 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, 200 nm, 205 nm, 210 nm, 215 nm, 220 nm, 225 nm, 230 nm, 235 nm, 240 nm, 245 nm, 250 nm, 255 nm, 260 nm, 265 nm, 270 nm, 275 nm, 280 nm, 285 nm, 290 nm, 295 nm, or 300 nm. Optionally, the first visibly transparent photoactive layer and the second visibly transparent photoactive layer correspond to separate, mixed, or partially mixed layers.

A variety of compounds are useful as the photoactive compounds in the described visibly transparent photovoltaic devices. For example, the photoactive compound may optionally exhibit a peak absorption in the near-infrared. Optionally, the photoactive compound may exhibit a peak absorption in the ultraviolet.

Example photoactive compounds described herein and useful for a photoactive layer in a visibly transparent photovoltaic device include those incorporating metal dithiolate complexes, also referred to as metal dithiolate compounds or metal dithiolene compounds, such as nickel dithiolate compounds, cobalt dithiolate compounds, iron dithiolate compounds, zinc dithiolate compounds, molybdenum dithiolate compounds, palladium dithiolate compounds, platinum dithiolate compounds, etc. In some examples, a photoactive compound provided herein has the formula

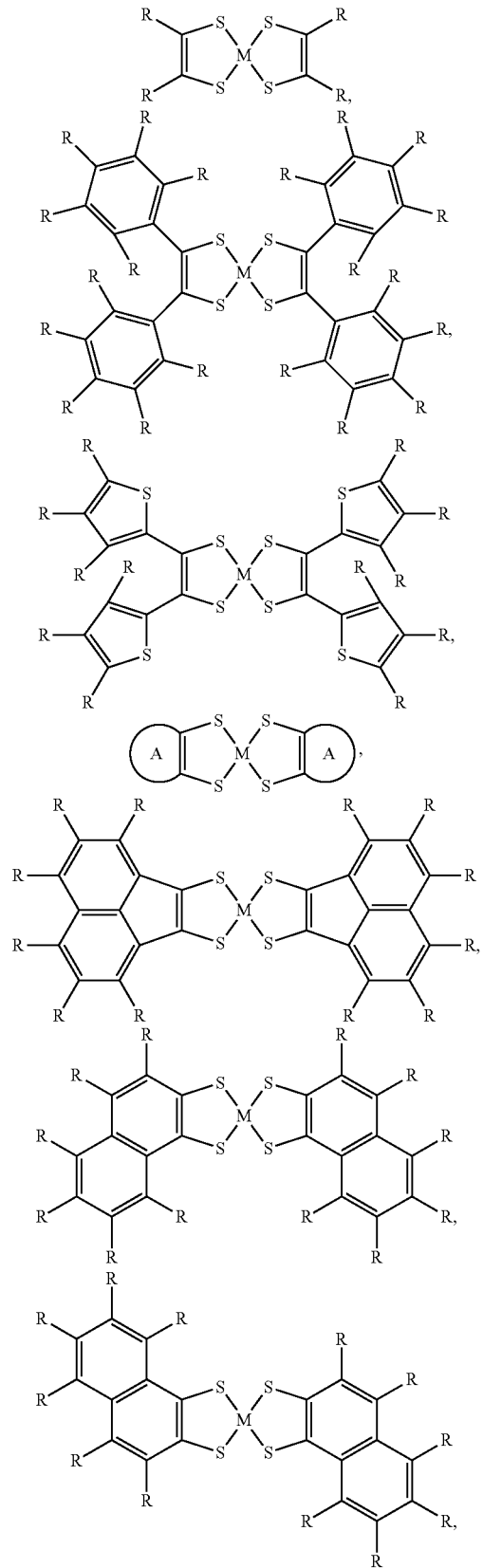

-continued

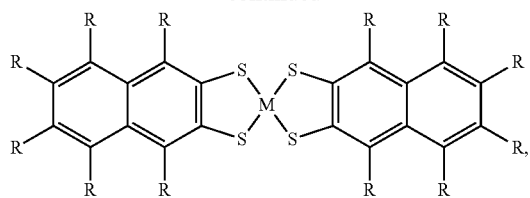

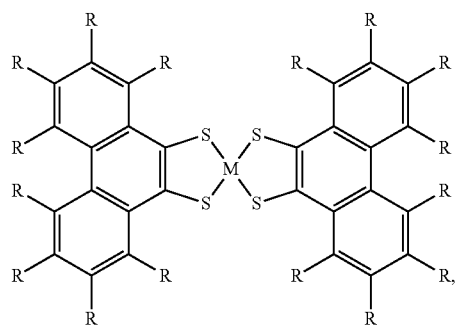

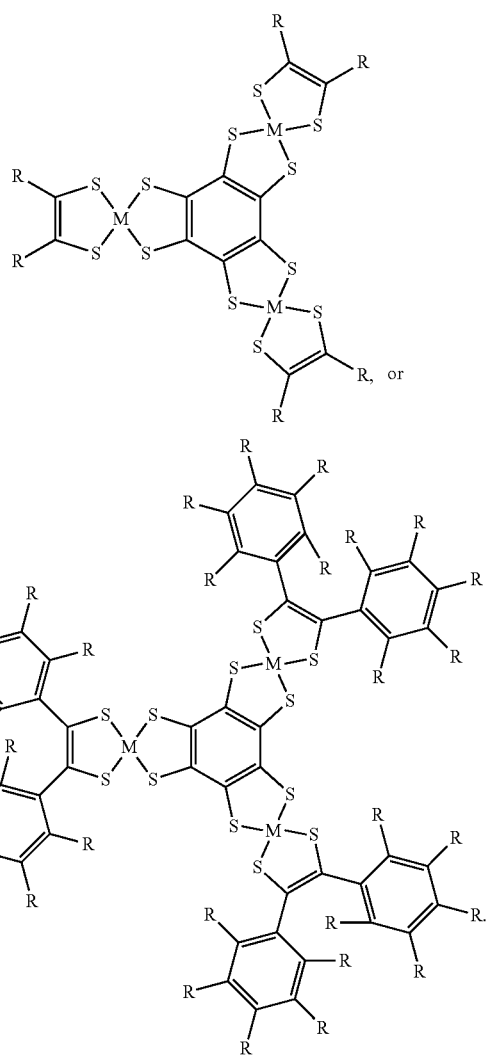

In embodiments, each M is independently a metal, such as Fe, Co, Ni, Cu, Zn, Mo, Pd, or Pt. In embodiments, each R group is independently a hydrogen, a halogen, a cyano group, a substituted or unsubstituted alkyl group, a substituted or unsubstituted alkenyl group, a substituted or unsubstituted aromatic group, a substituted or unsubstituted fused aromatic group, a substituted or unsubstituted heteroaromatic group, a substituted or unsubstituted fused heteroaromatic group, or a substituted or unsubstituted alkoxy group. Optionally, two or more R groups form a substituted or unsubstituted ring group or a substituted or unsubstituted fused ring group. In embodiments, each A is independently a fused polycyclic ring group having one or more R group substituents. Optionally, one or more R groups are each independently a methoxy group, a dimethyl amino group, a cyano group a thiazolyl group, a phenyl group, a maleimide group, a naphthyl group, or a phenanthrene group.

A visibly transparent photoactive compound having the formula:

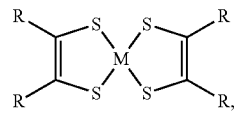

may be further characterized by the formula:

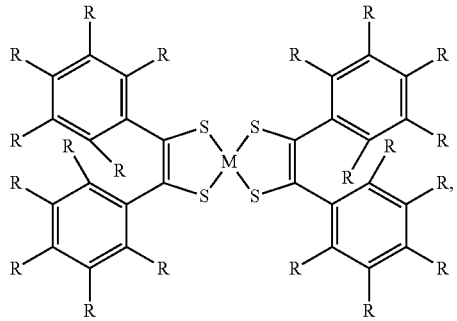

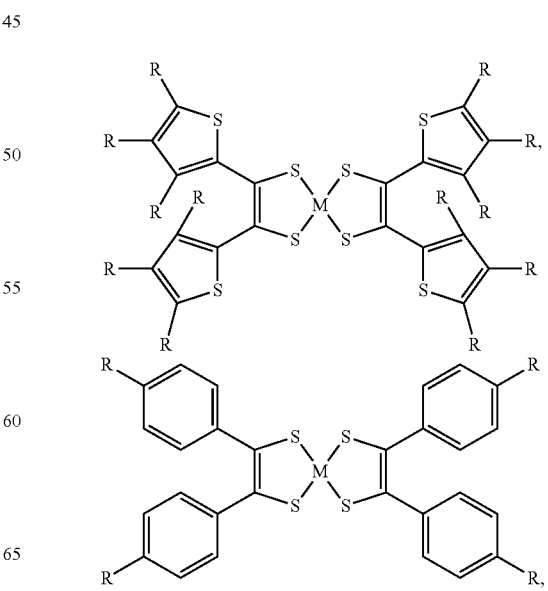

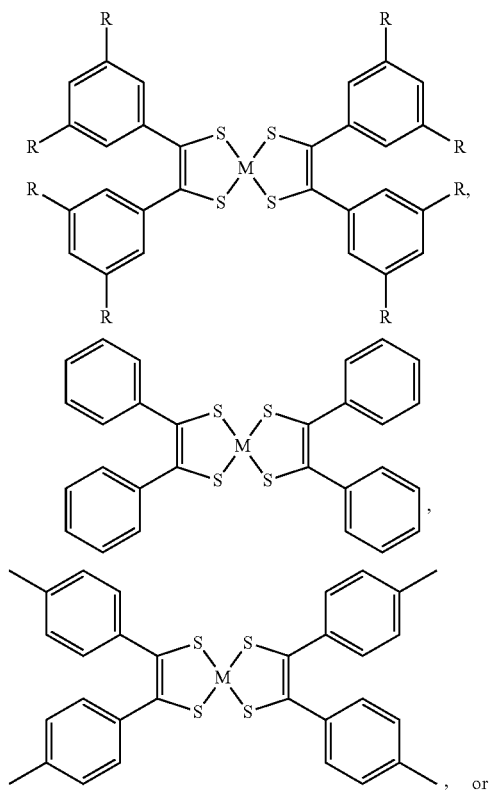
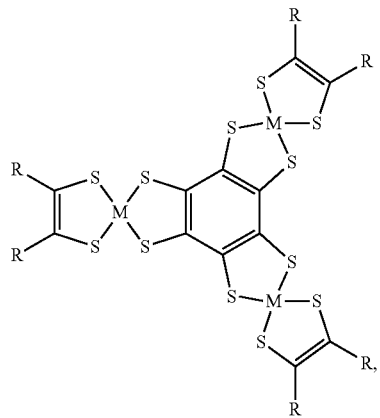
A visibly transparent photoactive compound having the formula:
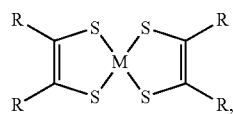
may be further characterized by the formula
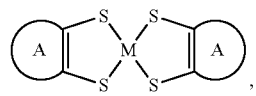
where each A is independently a fused polycyclic ring group having one or more R group substituents. For example, the visibly transparent photoactive compound may have the formula
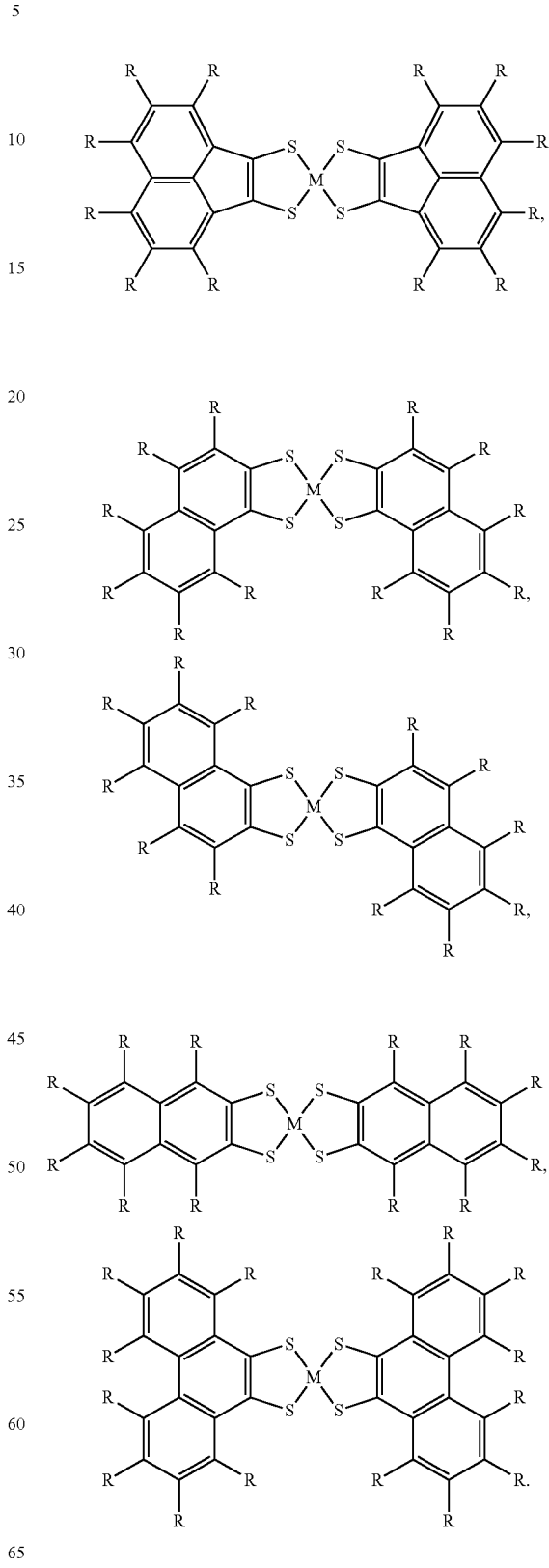

Specific photoactive compounds include, but are not limited to
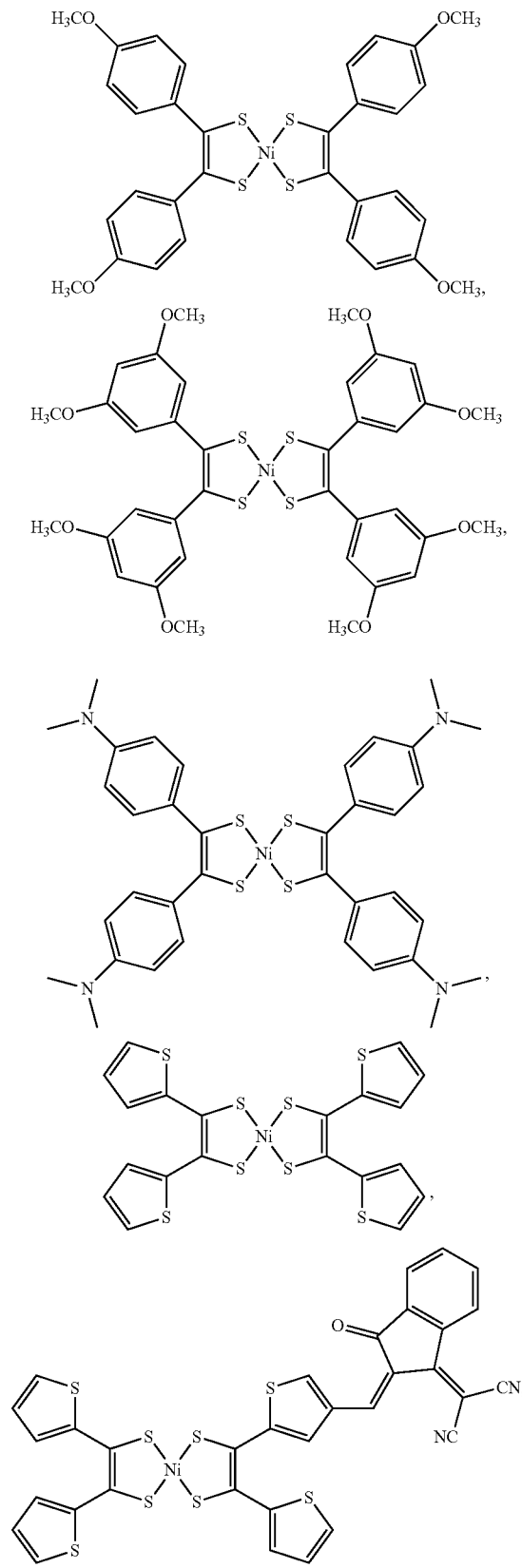
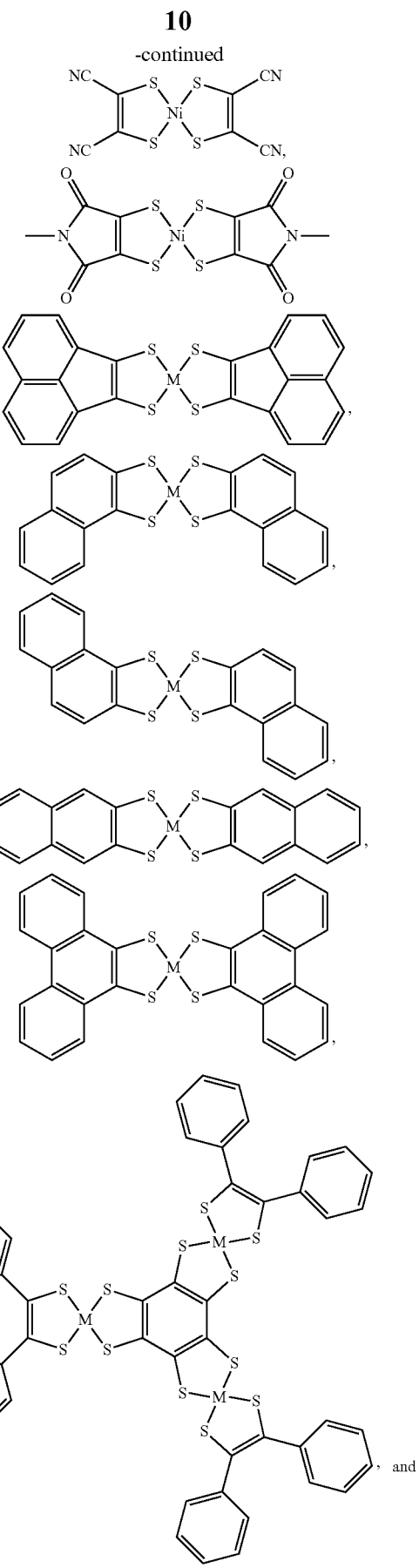

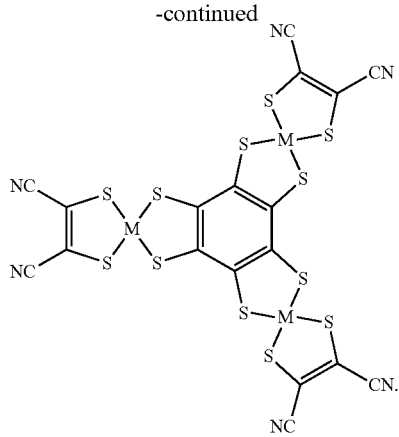

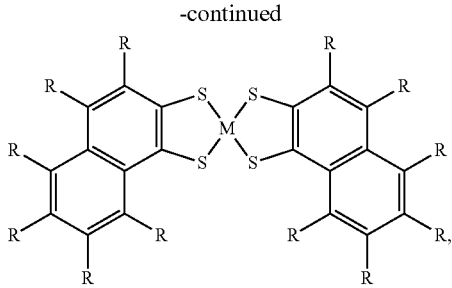

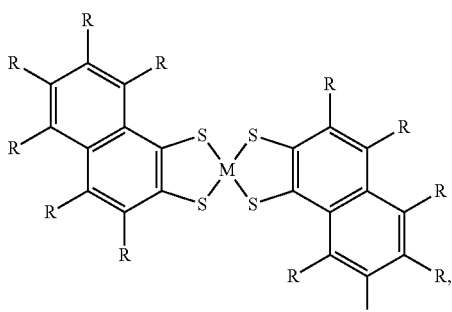

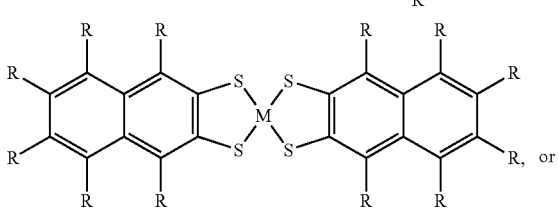

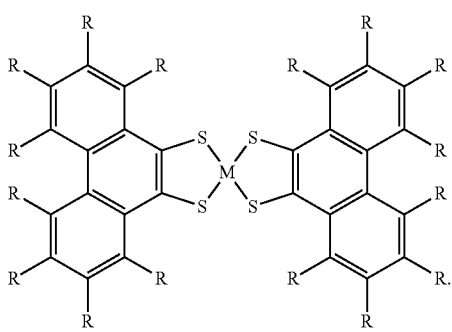

In another aspect, visibly transparent photoactive compounds are provided, which may be useful, for example, as photoactive materials in a photoactive layer of a visibly transparent photovoltaic device. A photoactive compound of this aspect may have the formula:

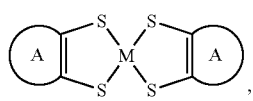

where M is a metal, each A is independently a fused polycyclic ring group having one or more R group substituents, and each R group is independently a hydrogen, a halogen, a cyano group, a substituted or unsubstituted alkyl group, a substituted or unsubstituted alkenyl group, a substituted or unsubstituted aromatic group, a substituted or unsubstituted fused aromatic group, a substituted or unsubstituted heteroaromatic group, a substituted or unsubstituted fused heteroaromatic group, or a substituted or unsubstituted alkoxy group. Optionally, two or more R groups form a substituted or unsubstituted ring group or a substituted or unsubstituted fused ring group. Optionally, M is Fe, Co, Ni, Cu, Zn, Mo, Pd, or Pt. Optionally, one or more R groups are each independently a methoxy group, a phenyl group, a dimethyl amino group, a cyano group a thiazolyl group, or a phenyl group. Optionally, A includes a thiazolyl group, a phenyl group, a maleimide group, a naphthyl group, an acenaphthalene group, or a phenanthrene group. It will be appreciated that these compounds may exhibit stronger maximum absorption strengths in the near-infrared than maximum absorption strengths in the visible.

For example, a photoactive compound of this aspect may have the formula:

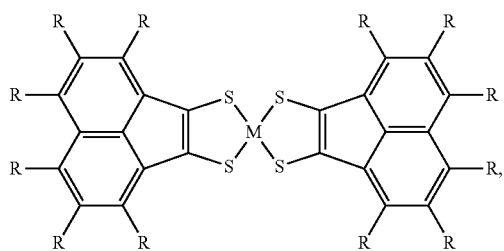

Optionally, a compound of this aspect has the formula:

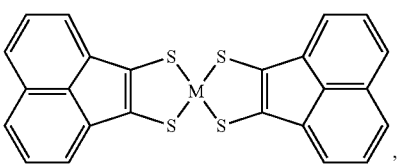

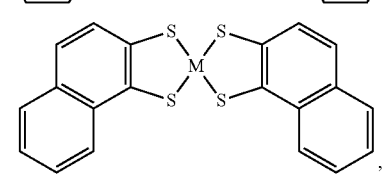

-continued

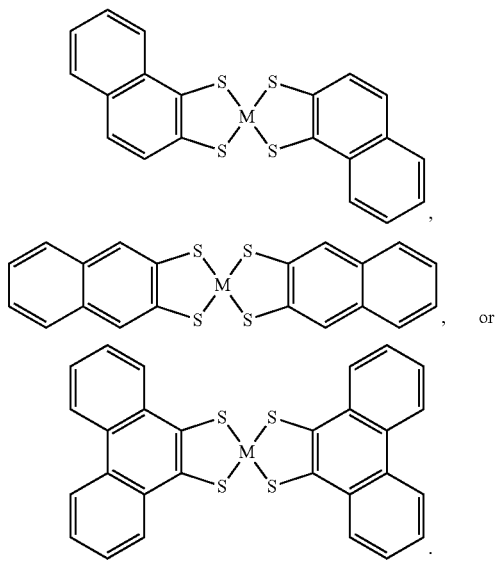

Specific visibly transparent photoactive compounds include those having the formula:

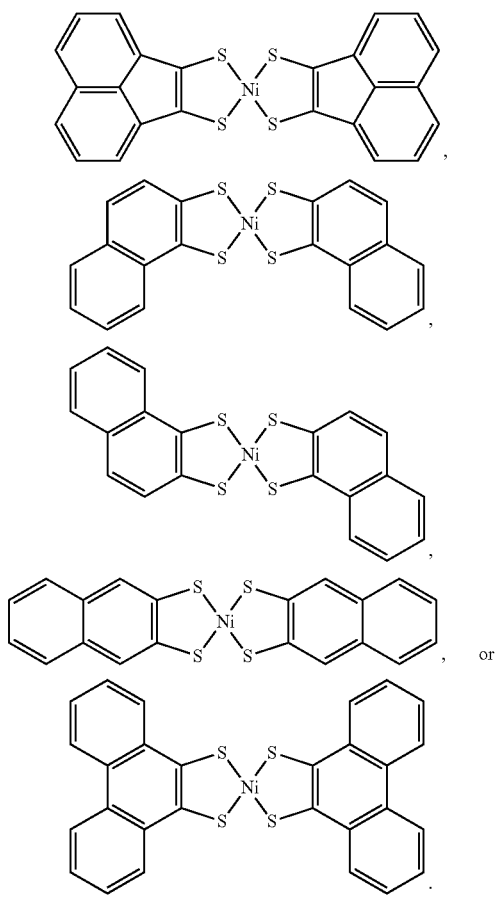

Again, it will be appreciated that these compounds may exhibit stronger maximum absorption strengths in the near-infrared than maximum absorption strengths in the visible.

A photoactive compound of this aspect may alternatively have the formula:

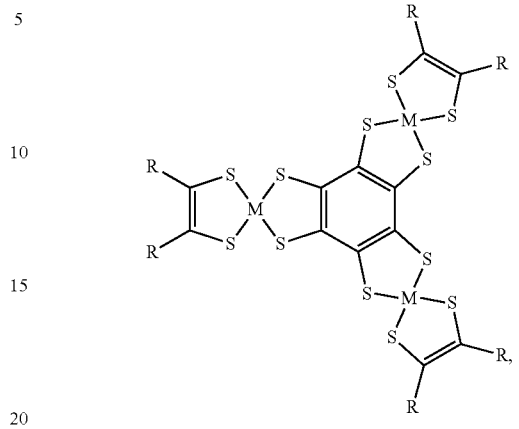

where M is a metal, such as Fe, Co, Ni, Cu, Zn, Mo, Pd, or Pt, each R group is independently a hydrogen, a halogen, a cyano group, a substituted or unsubstituted alkyl group, a substituted or unsubstituted alkenyl group, a substituted or unsubstituted aromatic group, a substituted or unsubstituted fused aromatic group, a substituted or unsubstituted heteroaromatic group, a substituted or unsubstituted fused heteroaromatic group, or a substituted or unsubstituted alkoxy group, or wherein two or more R groups form a substituted or unsubstituted ring group or a substituted or unsubstituted fused ring group. Optionally, one or more R groups are independently a methoxy group, a phenyl group, a dimethyl amino group, a cyano group a thiazolyl group, or a phenyl group. It will be appreciated that these compounds may exhibit stronger maximum absorption strengths in the near-infrared than maximum absorption strengths in the visible.

For example, a photoactive compound of this aspect may have the formula:

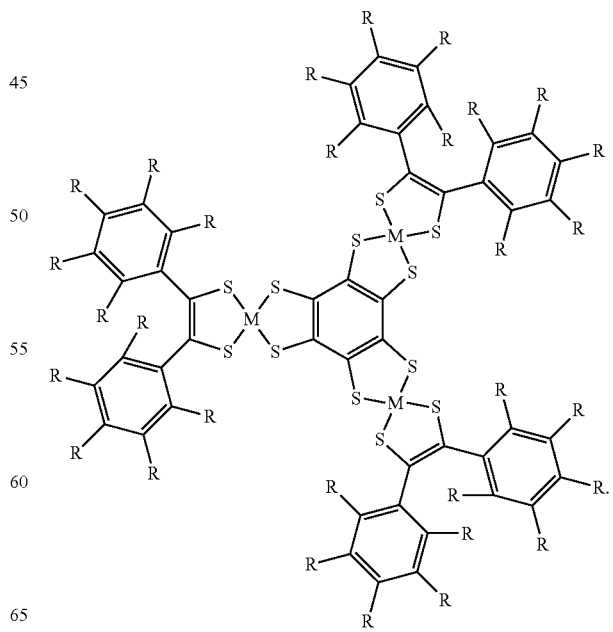

Optionally, a photoactive compound has the formula

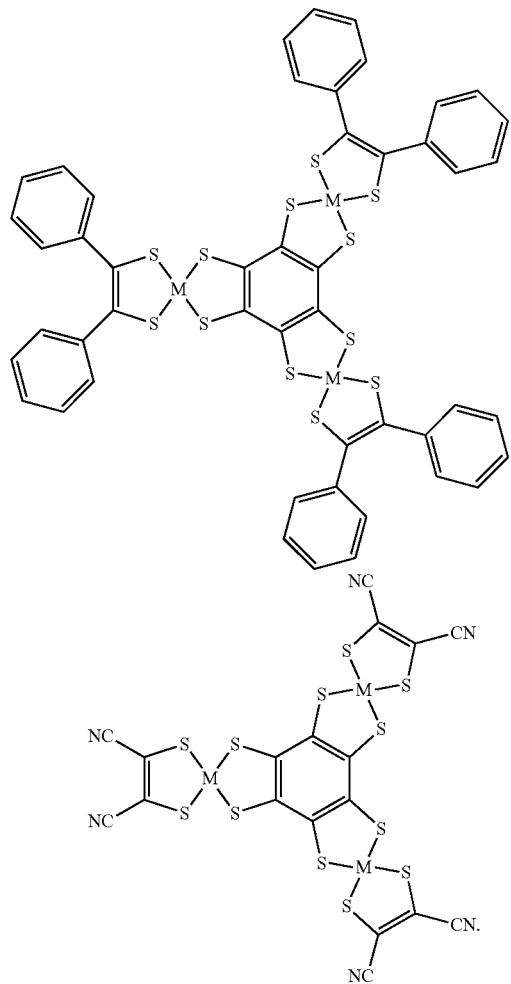

or

Specific photoactive compounds include those having the formula:

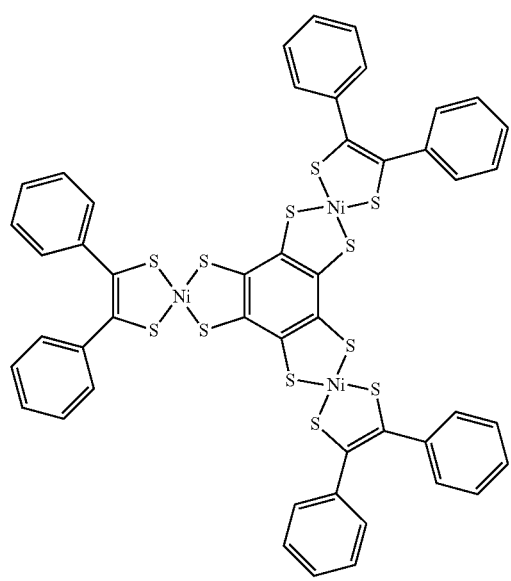

or

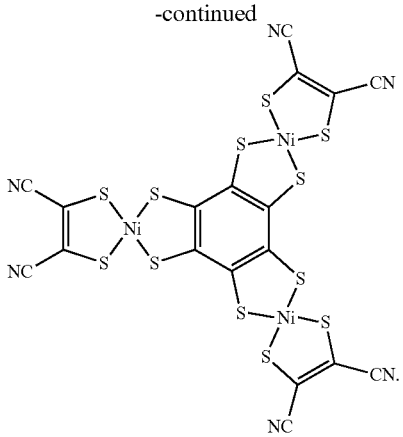

Again, it will be appreciated that these compounds may exhibit stronger maximum absorption strengths in the near-infrared than maximum absorption strengths in the visible.

Advantageously, the disclosed photoactive compounds exhibit greater maximum or peak near-infrared absorption strength than the maximum or peak visible absorption strength. In some embodiments, the disclosed photoactive compounds exhibit an integrated near-infrared absorption coefficient that is great than an integrated visible absorption coefficient. For example, some embodiments of the disclosed photoactive compounds exhibit peak absorption outside a visible wavelength band (450 nm to 650 nm), such as in the near-infrared wavelength band (650 nm to 1400 nm). By preferentially absorbing near-infrared radiation, the disclosed photoactive compounds may exhibit visible transparency and advantageously be useful for incorporation in visibly transparent photovoltaic devices. It will be appreciated, in various embodiments, that different maximum visible absorption or minimum visible transmittance may be selected for a particular target application. For example, in some embodiments, a visible transmittance of 30% or absorption of 70% may be desirable for some applications. In other embodiments, a visible transmittance of 100% or absorption of 0% may be desirable for some applications. In this way, a visibly transparent photovoltaic cell may absorb some visible light as well as near-infrared and/or ultraviolet light for purposes of photovoltaic generation (or incidental absorption), and still meet a target visible transparency level.

As used herein, the terms visible transparency, visibly transparent, and the like refer to a character of a material that exhibits an overall absorption, average absorption, or maximum absorption in the visible band of 0%-70%, such as less than or about 70%, less than or about 65%, less than or about 60%, less than or about 55%, less than or about 50%, less than or about 45%, less than or about 40%, less than or about 35%, less than or about 30%, less than or about 25%, or less than or about 20%. Stated another way, visibly transparent materials may transmit 30%-100% of incident visible light, such as greater than or about 80% of incident visible light, greater than or about 75% of incident visible light, greater than or about 70% of incident visible light, greater than or about 65% of incident visible light, greater than or about 60% of incident visible light, greater than or about 55% of incident visible light, greater than or about 50% of incident visible light, greater than or about 45% of incident visible light, greater than or about 40% of incident visible light, greater than or about 35% of incident visible light, or greater than or about 30% of incident visible light. Visibly transparent materials are generally considered at least partially see-through (i.e., not completely opaque) when viewed by a human. Optionally, visibly transparent materials may be colorless (i.e., not exhibit strong visible absorption features that would provide an appearance of a particular color) when viewed by a human.

Various different R-group substitutions are contemplated herein. For example, in some embodiments, one or more R groups are independently H, $CH_3$, F, Cl, CN, $OCH_3$, $C(CH_3)_3$, or Ar—R, wherein Ar is an aromatic or heteroaromatic group, and wherein Ar—R corresponds to the aromatic or heteroaromatic group having one or more R group substituents. Optionally, one or more R groups are independently a thiazolyl group, a phenyl group, a pyridinyl group, an imidazolyl group, a pyrrolyl group, a thiophenyl group, a naphthyl group, a pyrenyl group, an indolyl group, a benzothiophenyl group, a benzimidazolyl group, or a benzothiazolyl group. In some embodiments, two or more R groups form an unfused aromatic or heteroaromatic group or two or more R groups form a fused aromatic or heteroaromatic group.

The disclosed photoactive compounds and materials are useful in visibly transparent photovoltaic devices, such as a visibly transparent photovoltaic device that comprises a visibly transparent substrate; a first visibly transparent electrode coupled to the visibly transparent substrate; a first visibly transparent active layer coupled to the first visibly transparent electrode, such as a first visibly transparent photoactive layer that comprises a photoactive compound described herein exhibiting a greater maximum near-infrared absorption strength than maximum visible absorption strength; a second visibly transparent photoactive layer coupled to the first visibly transparent photoactive layer and exhibiting greater maximum ultraviolet absorption strength or maximum near-infrared absorption strength than maximum visible absorption strength; and a second visibly transparent electrode coupled to the second visibly transparent photoactive layer.

As will be described below in further detail, the photoactive compounds described herein may be useful as electron donor materials or electron acceptor materials. In embodiments, the second visibly transparent photoactive layer may include a second photoactive compound which may be useful as the opposite material, such as an electron acceptor material when the photoactive material of the first visibly transparent photoactive layer is an electron donor material or as an electron donor material when the photoactive material of the first visibly transparent photoactive layer is an electron acceptor material. The photoactive compounds used in a photoactive layer may have any suitable concentration. In some embodiments, a photoactive compound is present as a layer of substantially pure form. In some embodiments, however, photoactive layers may be present as mixed forms, such as where multiple photoactive compounds are present, such as an electron acceptor material and an electron donor material. Different photoactive materials may have any suitable concentration or concentration ratios to achieve photovoltaic generation in the devices described herein. Optionally, the first and second visibly transparent photoactive layers independently have thicknesses of about 1 nm to about 300 nm. Optionally, the first visibly transparent photoactive layer and the second visibly transparent photoactive layer correspond to separate, mixed, or partially mixed layers.

The other layers used in the visibly transparent photovoltaic devices may exhibit suitable compositions and properties for operation of the transparent photovoltaic device. For example, various visibly transparent substrates may be suitable, such as those composing transparent glasses, transparent polymers, etc. In some embodiments, the visibly transparent substrate may be transparent to near-infrared light (i.e., light with a wavelength greater than 650 nm) and/or ultraviolet light (i.e., light with a wavelength less than 450 nm). In this way, the visibly transparent substrate may not absorb near-infrared and/or ultraviolet light that would be suitable for photovoltaic energy generation by the visibly transparent photovoltaic devices. In some embodiments, however, the visibly transparent substrate may absorb infrared and/or ultraviolet light, which may be useful, for example, for configurations where the visibly transparent substrate serves to block excess infrared or ultraviolet radiation incident radiation after passing through the photoactive layer(s) to prevent or reduce overall ultraviolet and/or infrared transmission. Useful visibly transparent substrates include, but are not limited to, those having thicknesses of about 50 nm to about 30 mm.

Example visibly transparent electrodes include those comprising indium tin oxide or thin transparent films of conductive elements, such as copper, gold, silver, aluminum, etc. In cases where the visibly transparent electrodes comprise conductive elements, the thickness may be such that even though the conductive element may be opaque in the bulk, when used as a thin film the conductive element may still allow for transmission of visible light. Useful visibly transparent electrodes include, but are not limited to, those having thicknesses of about 1 nm to about 500 nm.

Other layers may be present in the visibly transparent photovoltaic devices described herein. For example, a visibly transparent photovoltaic device may optionally comprise one or more buffer layers, such as a first a first buffer layer disposed between the first visibly transparent electrode and the first visibly transparent photoactive layer and/or a second buffer layer disposed between the second visibly transparent photoactive layer and the second visibly transparent electrode. Useful buffer layers may serve a variety of purposes and include various compositions. For example, in some cases, a buffer layer may comprise a photoactive material or compound described herein. Optionally, useful buffer layers have thicknesses of about 1 nm to about 500 nm.

In another aspect, methods are provided, such as methods of making visibly transparent photoactive materials and methods of making visibly transparent photovoltaic devices. In an embodiment, a method of this aspect comprises providing a transparent substrate; optionally forming one or more optical layers on the transparent substrate; forming a first transparent electrode; optionally forming a first buffer layer on the first transparent electrode; forming one or more photoactive layers, such as including a photoactive compound described herein; optionally forming a second buffer layer; forming a second transparent electrode; and optionally forming one or more optical layers on the second transparent electrode. Optionally, one or more buffer layers include a photoactive compound described herein. In some embodiments, forming one or more layers may include making a photoactive compound and depositing the photoactive compound. Examples of making various photoactive compounds provided herein are described below.

Variations on these different steps will be appreciated in view of the present disclosure. For example, the photoactive layers may be provided as separate or mixed layers including electron acceptor and electron donor materials. Different optical layers may be used, for example, such as index matching layers, antireflection layers, etc.

Various techniques may be useful for forming one or more layers, including vacuum deposition techniques and solution deposition techniques. In one embodiment, thermal evaporation is used for depositing a photoactive compound as part of a photoactive layer. It will be appreciated that various patterning techniques may be useful in methods of making a visibly transparent photovoltaic device. For example, visibly transparent electrodes may be optionally patterned, visibly active photoactive layers may be optionally patterned, buffer layers may be optionally patterned, optical layers may be patterned, etc. Suitable patterning techniques may include, are not limited to, patterning techniques involving lithography, masking, lift-off, etching, etc.

These and other embodiments and aspects of the invention along with many of its advantages and features are described in more detail in conjunction with the text below and attached figures.

DETAILED DESCRIPTION OF SPECIFIC EMBODIMENTS

Figure 1A:
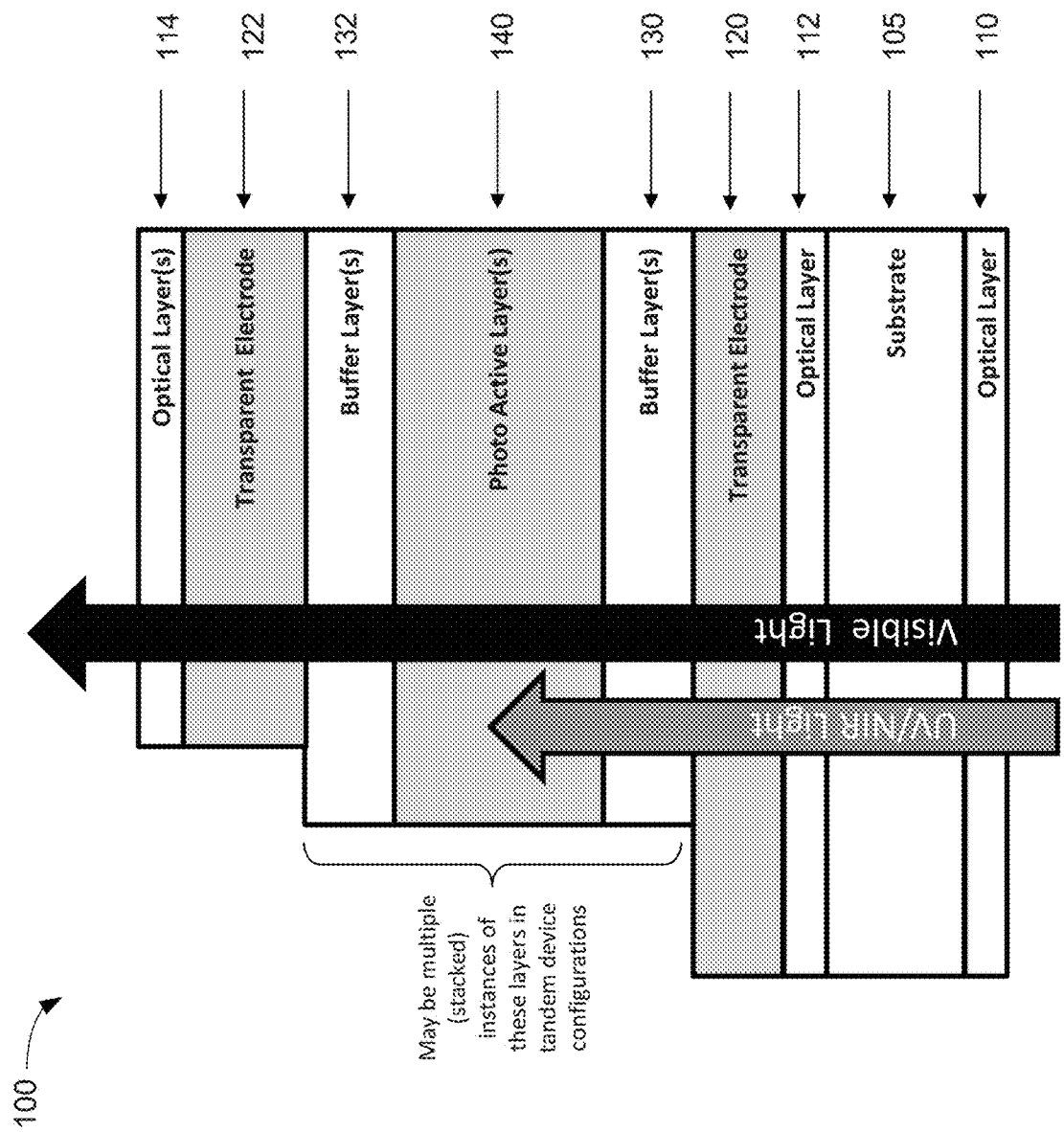
FIG. 1A is a simplified schematic diagram illustrating a visibly transparent photovoltaic device according to an embodiment of the present invention.

The present disclosure relates to visibly transparent photoactive compounds and visibly transparent photovoltaic devices incorporating visibly transparent photoactive compounds. The visibly transparent photoactive compounds absorb light more strongly in the near-infrared region and less strongly in the visible region, permitting their use in visibly transparent photovoltaic devices. The disclosed visibly transparent photovoltaic devices include visibly transparent electrodes with visibly transparent photoactive materials positioned between the visibly transparent electrodes.

The disclosed visibly transparent photoactive compounds include metal dithiolate dyes. Example visibly transparent photoactive compounds include metal dithiolate complexes including organic or heterorganic substituents that may be functionalized to modulate the absorption by the compounds. For example, the disclosed photoactive compounds share a common structural features of

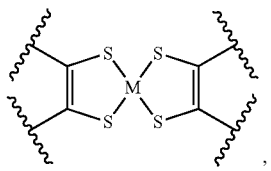

where the wavy lines represent positions at which the structure is connected to another part of the compound, which may be parts of the same compound (i.e., a ring or fused ring structure) or different substructures. In addition to the metal dithiolate components, other substructures of the visibly transparent photoactive compounds may be organic or heterorganic in nature. For example, visibly transparent compounds may include aromatic or heteroaromatic species, cyclic or heterocyclic species, each of which may be functionalized in order to achieve suitable optical and/or physical properties.

In some embodiments, for purification of the disclosed visibly transparent photoactive compounds, a very high molecular weight, e.g., about 500 amu or higher, about 550 amu or higher, about 600 amu or higher, about 650 amu or higher, about 700 amu or higher, about 750 amu or higher, about 800 amu or higher, or between 500 amu and 2000 amu, may be undesirable, as compounds with very high molecular weights may have limited volatilities, and methods of making and purifying visibly transparent photoactive compounds may employ an evaporation or sublimation-based purification method. In addition, the visibly transparent photoactive compounds may be deposited into a visibly transparent photovoltaic device using a thermal evaporation technique and compounds of very high molecular weight may be difficult to deposit using thermal evaporation. In various embodiments, the visibly transparent photoactive compounds described herein have a molecular weight of 200 amu to 700 amu, less than or about 700 amu, less than or about 650 amu, less than or about 600 amu, less than or about 550 amu, less than or about 500 amu, less than or about 450 amu, less than or about 400 amu, less than or about 350 amu, less than or about 300 amu, less than or about 250 amu, or less than or about 200 amu.

To achieve desired optical properties, visibly transparent photoactive compounds may exhibit a molecular electronic structure where photons of near-infrared light are absorbed, which results in promotion of an electron to a higher molecular orbital, with an energy difference matching that of the absorbed photon. Compounds exhibiting extended aromaticity or extended conjugation are beneficial, as compounds with extended aromaticity or extended conjugation may exhibit electronic absorption with energies matching that of near-infrared and/or ultraviolet photons. In some cases, however, extended aromaticity or extended conjugation may result in absorption in the visible band (i.e., between about 450 nm and about 650 nm). In addition to conjugation and aromaticity, absorption features may be modulated by inclusion of heteroatoms in the organic structure of the visibly transparent photoactive compounds, such as nitrogen or sulfur atoms. Additionally or alternatively, absorption features may be modulated by the presence and positions of electron donating or electron withdrawing groups, such as halogen atoms, alkyl groups, alkoxy groups, etc. bonded to a core- or sub-structure of the visibly transparent photoactive compounds. Further, absorption features may optionally be modulated by the presence of electron donor groups or electron acceptor group within a photoactive compound. Additionally or alternatively, absorption features may be modulated by the identity of the central metal atom.

In general the terms and phrases used herein have their art-recognized meaning, which can be found by reference to standard texts, journal references and contexts known to those skilled in the art. The following definitions are provided to clarify their specific use in the context of the invention.

As used herein, "maximum absorption strength" refers to the largest absorption value in a particular spectral region, such as the ultraviolet band (200 nm to 450 nm or 280 nm to 450 nm), the visible band (450 nm to 650 nm), or the near-infrared band (650 nm to 1400 nm). In some examples, a maximum absorption strength may correspond to an absorption strength of an absorption feature that is a local or absolute maximum, such as an absorption band or peak, and may be referred to as a peak absorption. In some examples, a maximum absorption strength in a particular band may not correspond to a local or absolute maximum but may instead correspond to the largest absorption value in the particular band. Such a configuration may occur, for example, when an absorption feature spans multiple bands (e.g., visible and near-infrared), and the absorption values from the absorption feature that occur within the visible band are smaller than those occurring within the near-infrared band, such as when the peak of the absorption feature is located within the near-infrared band but a tail of the absorption feature extends to the visible band. In some embodiments, a visibly transparent photoactive compound described herein may having an absorption peak at a wavelength greater than about 650 nanometers (i.e., in the near-infrared), and the visibly transparent photoactive material's absorption peak may be greater than the visibly transparent photoactive material's absorption at any wavelength between about 450 and 650 nanometers.

In an embodiment, disclosed compositions or compounds are isolated or purified. In an embodiment, an isolated or purified compound is at least partially isolated or purified as would be understood in the art. In an embodiment, a disclosed composition or compound has a chemical purity of 90%, optionally for some applications 95%, optionally for some applications 99%, optionally for some applications 99.9%, optionally for some applications 99.99%, and optionally for some applications 99.999% pure.

Compounds disclosed herein optionally contain one or more ionizable groups. Ionizable groups include groups from which a proton can be removed (e.g., —COOH) or added (e.g., amines) and groups which can be quaternized (e.g., amines). All possible ionic forms of such molecules and salts thereof are intended to be included individually in the disclosure herein. With regard to salts of the compounds described herein, it will be appreciated that a wide variety of available counter-ions may be selected that are appropriate for preparation of salts of this invention for a given application. In specific applications, the selection of a given anion or cation for preparation of a salt can result in increased or decreased solubility of that salt.

The disclosed compounds optionally contain one or more chiral centers. Accordingly, this disclosure includes racemic mixtures, diastereomers, enantiomers, tautomers and mixtures enriched in one or more stereoisomer. Disclosed compounds including chiral centers encompass the racemic forms of the compound as well as the individual enantiomers and non-racemic mixtures thereof.

As used herein, the terms "group" and "moiety" may refer to a functional group of a chemical compound. Groups of the disclosed compounds refer to an atom or a collection of atoms that are a part of the compound. Groups of the disclosed compounds may be attached to other atoms of the compound via one or more covalent bonds. Groups may also be characterized with respect to their valence state. The present disclosure includes groups characterized as monovalent, divalent, trivalent, etc. valence states. In embodiments, the term "substituent" may be used interchangeably with the terms "group" and "moiety."

As is customary and well known in the art, hydrogen atoms in chemical formulas disclosed herein are not always explicitly shown, for example, hydrogen atoms bonded to the carbon atoms of aliphatic, aromatic, alicyclic, carbocyclic and/or heterocyclic rings are not always explicitly shown in the formulas recited. The structures provided herein, for example in the context of the description of any specific formulas and structures recited, are intended to convey the chemical composition of disclosed compounds of methods and compositions. It will be appreciated that the structures provided do not indicate the specific positions of atoms and bond angles between atoms of these compounds.

As used herein, the terms "alkylene" and "alkylene group" are used synonymously and refer to a divalent group derived from an alkyl group as defined herein. The present disclosure includes compounds having one or more alkylene groups. Alkylene groups in some compounds function as attaching and/or spacer groups. Disclosed compounds optionally include substituted and/or unsubstituted $C_1$-$C_{20}$ alkylene, $C_1$-$C_{10}$ alkylene and $C_1$-$C_5$ alkylene groups.

As used herein, the terms "cycloalkylene" and "cycloalkylene group" are used synonymously and refer to a divalent group derived from a cycloalkyl group as defined herein. The present disclosure includes compounds having one or more cycloalkylene groups. Cycloalkyl groups in some compounds function as attaching and/or spacer groups. Disclosed compounds optionally include substituted and/or unsubstituted $C_3$-$C_{20}$ cycloalkylene, $C_3$-$C_{10}$ cycloalkylene and $C_3$-$C_5$ cycloalkylene groups.

As used herein, the terms "arylene" and "arylene group" are used synonymously and refer to a divalent group derived from an aryl group as defined herein. The present disclosure includes compounds having one or more arylene groups. In some embodiments, an arylene is a divalent group derived from an aryl group by removal of hydrogen atoms from two intra-ring carbon atoms of an aromatic ring of the aryl group. Arylene groups in some compounds function as attaching and/or spacer groups. Arylene groups in some compounds function as chromophore, fluorophore, aromatic antenna, dye and/or imaging groups. Disclosed compounds optionally include substituted and/or unsubstituted $C_3$-$C_{30}$ arylene, $C_3$-$C_{20}$ arylene, $C_3$-$C_{10}$ arylene and $C_1$-$C_5$ arylene groups.

As used herein, the terms "heteroarylene" and "heteroarylene group" are used synonymously and refer to a divalent group derived from a heteroaryl group as defined herein. The present disclosure includes compounds having one or more heteroarylene groups. In some embodiments, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as attaching and/or spacer groups. Heteroarylene groups in some compounds function as chromophore, aromatic antenna, fluorophore, dye and/or imaging groups. Disclosed compounds optionally include substituted and/or unsubstituted $C_3$-$C_{30}$ heteroarylene, $C_3$-$C_{20}$ heteroarylene, $C_1$-$C_{10}$ heteroarylene and $C_3$-$C_5$ heteroarylene groups.

As used herein, the terms "alkenylene" and "alkenylene group" are used synonymously and refer to a divalent group derived from an alkenyl group as defined herein. The present disclosure includes compounds having one or more alkenylene groups. Alkenylene groups in some compounds function as attaching and/or spacer groups. Disclosed compounds optionally include substituted and/or unsubstituted $C_2$-$C_{20}$ alkenylene, $C_2$-$C_{10}$ alkenylene and $C_2$-$C_5$ alkenylene groups.

As used herein, the terms "cylcoalkenylene" and "cylcoalkenylene group" are used synonymously and refer to a divalent group derived from a cylcoalkenyl group as defined herein. The present disclosure includes compounds having one or more cylcoalkenylene groups. Cycloalkenylene groups in some compounds function as attaching and/or spacer groups. Disclosed compounds optionally include substituted and/or unsubstituted $C_3$-$C_{20}$ cylcoalkenylene, $C_3$-$C_{10}$ cylcoalkenylene and $C_3$-$C_5$ cylcoalkenylene groups.

As used herein, the terms "alkynylene" and "alkynylene group" are used synonymously and refer to a divalent group derived from an alkynyl group as defined herein. The present disclosure includes compounds having one or more alkynylene groups. Alkynylene groups in some compounds function as attaching and/or spacer groups. Disclosed compounds optionally include substituted and/or unsubstituted $C_2$-$C_{20}$ alkynylene, $C_2$-$C_{10}$ alkynylene and $C_2$-$C_5$ alkynylene groups.

As used herein, the term "halo" refers to a halogen group, such as a fluoro (—F), chloro (—Cl), bromo (—Br), or iodo (—I).

The term "heterocyclic" refers to ring structures containing at least one other kind of atom, in addition to carbon, in the ring. Examples of such atoms include sulfur, selenium, tellurium, nitrogen, phosphorus, silicon, germanium, boron, aluminum, and a transition metal. Examples of heterocyclic rings include, but are not limited to, pyrrolidinyl, piperidinyl, imidazolidinyl, tetrahydrofuranyl, tetrahydrothienyl, furanyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, triazolyl and tetrazolyl groups. Atoms of heterocyclic rings can be bonded to a wide range of other atoms and functional groups, for example, provided as substituents.

The term "carbocyclic" refers to ring structures containing only carbon atoms in the ring. Carbon atoms of carbocyclic rings can be bonded to a wide range of other atoms and functional groups, for example, provided as substituents.

The term "alicyclic" refers to a ring that is not an aromatic ring. Alicyclic rings include both carbocyclic and heterocyclic rings.

The term "aliphatic" refers to non-aromatic hydrocarbon compounds and groups. Aliphatic groups generally include carbon atoms covalently bonded to one or more other atoms, such as carbon and hydrogen atoms. Aliphatic groups may, however, include a non-carbon atom, such as an oxygen atom, a nitrogen atom, a sulfur atom, etc., in place of a carbon atom. Non-substituted aliphatic groups include only hydrogen substituents. Substituted aliphatic groups include non-hydrogen substituents, such as halo groups and other substituents described herein. Aliphatic groups can be straight chain, branched, or cyclic. Aliphatic groups can be saturated, meaning only single bonds join adjacent carbon (or other) atoms. Aliphatic groups can be unsaturated, meaning one or more double bonds or triple bonds join adjacent carbon (or other) atoms.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 3-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, or 7-member ring(s). The carbon rings in cycloalkyl groups can also carry alkyl groups. Cycloalkyl groups can include bicyclic and tricycloalkyl groups. Alkyl groups are optionally substituted. Substituted alkyl groups include, among others, those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully-halogenated or semi-halogenated alkyl groups, such as alkyl groups having one or more hydrogens replaced with one or more fluorine atoms, chlorine atoms, bromine atoms and/or iodine atoms. Substituted alkyl groups include fully-fluorinated or semi-fluorinated alkyl groups, such as alkyl groups having one or more hydrogens replaced with one or more fluorine atoms.

An alkoxy group is an alkyl group that has been modified by linkage to oxygen and can be represented by the formula R—O and can also be referred to as an alkyl ether group. Examples of alkoxy groups include, but are not limited to, methoxy, ethoxy, propoxy, butoxy and heptoxy. Alkoxy groups include substituted alkoxy groups wherein the alky portion of the groups is substituted as provided herein in connection with the description of alkyl groups. As used herein MeO— refers to $CH_3O$—.

Alkenyl groups include straight-chain, branched and cyclic alkenyl groups. Alkenyl groups include those having 1, 2 or more double bonds and those in which two or more of the double bonds are conjugated double bonds. Alkenyl groups include those having from 2 to 20 carbon atoms. Alkenyl groups include small alkenyl groups having 2 to 4 carbon atoms. Alkenyl groups include medium length alkenyl groups having from 5-10 carbon atoms. Alkenyl groups include long alkenyl groups having more than 10 carbon atoms, particularly those having 10-20 carbon atoms. Cycloalkenyl groups include those in which a double bond is in the ring or in an alkenyl group attached to a ring. The term cycloalkenyl specifically refers to an alkenyl group having a ring structure, including an alkenyl group having a 3-, 4-, 5-, 6-, 7-, 8-, 9- or 10-member carbon ring(s) and particularly those having a 3-, 4-, 5-, 6- or 7-member ring(s). The carbon rings in cycloalkenyl groups can also carry alkyl groups. Cycloalkenyl groups can include bicyclic and tricyclic alkenyl groups. Alkenyl groups are optionally substituted. Substituted alkenyl groups include among others those which are substituted with alkyl or aryl groups, which groups in turn can be optionally substituted. Specific alkenyl groups include ethenyl, prop-1-enyl, prop-2-enyl, cycloprop-1-enyl, but-1-enyl, but-2-enyl, cyclobut-1-enyl, cyclobut-2-enyl, pent-1-enyl, pent-2-enyl, branched pentenyl, cyclopent-1-enyl, hex-1-enyl, branched hexenyl, cyclohexenyl, all of which are optionally substituted. Substituted alkenyl groups include fully-halogenated or semi-halogenated alkenyl groups, such as alkenyl groups having one or more hydrogens replaced with one or more fluorine atoms, chlorine atoms, bromine atoms and/or iodine atoms. Substituted alkenyl groups include fully-fluorinated or semifluorinated alkenyl groups, such as alkenyl groups having one or more hydrogen atoms replaced with one or more fluorine atoms.

Aryl groups include groups having one or more 5-, 6- or 7-member aromatic and/or heterocyclic aromatic rings. The term heteroaryl specifically refers to aryl groups having at least one 5-, 6- or 7-member heterocyclic aromatic rings. Aryl groups can contain one or more fused aromatic and heteroaromatic rings or a combination of one or more aromatic or heteroaromatic rings and one or more non-aromatic rings that may be fused or linked via covalent bonds. Heterocyclic aromatic rings can include one or more N, O, or S atoms in the ring, among others. Heterocyclic aromatic rings can include those with one, two or three N atoms, those with one or two O atoms, and those with one or two S atoms, or combinations of one or two or three N, O or S atoms, among others. Aryl groups are optionally substituted. Substituted aryl groups include among others those which are substituted with alkyl or alkenyl groups, which groups in turn can be optionally substituted. Specific aryl groups include phenyl, biphenyl groups, pyrrolidinyl, imidazolidinyl, tetrahydrofuranyl, tetrahydrothienyl, furanyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, and naphthyl groups, all of which are optionally substituted. Substituted aryl groups include fully halogenated or semihalogenated aryl groups, such as aryl groups having one or more hydrogens replaced with one or more fluorine atoms, chlorine atoms, bromine atoms and/or iodine atoms. Substituted aryl groups include fully fluorinated or semifluorinated aryl groups, such as aryl groups having one or more hydrogens replaced with one or more fluorine atoms. Aryl groups include, but are not limited to, aromatic group-containing or heterocyclic aromatic group-containing groups corresponding to any one of the following: benzene, naphthalene, naphthoquinone, diphenylmethane, fluorene, anthracene, anthraquinone, phenanthrene, tetracene, tetracenedione, pyridine, quinoline, isoquinoline, indoles, isoindole, pyrrole, imidazole, oxazole, thiazole, pyrazole, pyrazine, pyrimidine, purine, benzimidazole, furans, benzofuran, dibenzofuran, carbazole, acridine, acridone, phenanthridine, thiophene, benzothiophene, dibenzothiophene, xanthene, xanthone, flavone, coumarin, azulene or anthracycline. As used herein, a group corresponding to the groups listed above expressly includes an aromatic or heterocyclic aromatic group, including monovalent, divalent and polyvalent groups, of the aromatic and heterocyclic aromatic groups listed herein are provided in a covalently bonded configuration in the compounds of the invention at any suitable point of attachment. In embodiments, aryl groups contain between 5 and 30 carbon atoms. In embodiments, aryl groups contain one aromatic or heteroaromatic six-membered ring and one or more additional five- or six-membered aromatic or heteroaromatic ring. In embodiments, aryl groups contain between five and eighteen carbon atoms in the rings. Aryl groups optionally have one or more aromatic rings or heterocyclic aromatic rings having one or more electron donating groups, electron withdrawing groups and/or targeting ligands provided as substituents.

Arylalkyl and alkylaryl groups are alkyl groups substituted with one or more aryl groups wherein the alkyl groups optionally carry additional substituents and the aryl groups are optionally substituted. Specific alkylaryl groups are phenyl-substituted alkyl groups, e.g., phenylmethyl groups. Alkylaryl and arylalkyl groups are alternatively described as aryl groups substituted with one or more alkyl groups wherein the alkyl groups optionally carry additional substituents and the aryl groups are optionally substituted. Specific alkylaryl groups are alkyl-substituted phenyl groups such as methylphenyl. Substituted arylalkyl groups include fully-halogenated or semi-halogenated arylalkyl groups, such as arylalkyl groups having one or more alkyl and/or aryl groups having one or more hydrogens replaced with one or more fluorine atoms, chlorine atoms, bromine atoms and/or iodine atoms.

As to any of the groups described herein which contain one or more substituents, it is understood that such groups do not contain any substitution or substitution patterns which are sterically impractical and/or synthetically nonfeasible. In addition, the disclosed compounds include all stereochemical isomers arising from the substitution of these compounds. Optional substitution of alkyl groups includes substitution with one or more alkenyl groups, aryl groups or both, wherein the alkenyl groups or aryl groups are optionally substituted. Optional substitution of alkenyl groups includes substitution with one or more alkyl groups, aryl groups, or both, wherein the alkyl groups or aryl groups are optionally substituted. Optional substitution of aryl groups includes substitution of the aryl ring with one or more alkyl groups, alkenyl groups, or both, wherein the alkyl groups or alkenyl groups are optionally substituted.

Optional substituents for any alkyl, alkenyl and aryl group includes substitution with one or more of the following substituents, among others:

halogen, including fluorine, chlorine, bromine or iodine;
pseudohalides, including —CN;
—COOR where R is a hydrogen or an alkyl group or an aryl group or, more specifically, where R is a methyl, ethyl, propyl, butyl, or phenyl group, all of which are optionally substituted;
—COR where R is a hydrogen or an alkyl group or an aryl group or, more specifically, where R is a methyl, ethyl, propyl, butyl, or phenyl group, all of which are optionally substituted;
—CON(R)$_2$ where each R, independently of each other R, is a hydrogen or an alkyl group or an aryl group or, more specifically, where R is a methyl, ethyl, propyl, butyl, or phenyl group, all of which are optionally substituted; and where R and R can form a ring which can contain one or more double bonds and can contain one or more additional carbon atoms;
—OCON(R)$_2$ where each R, independently of each other R, is a hydrogen or an alkyl group or an aryl group and, more specifically, where R is a methyl, ethyl, propyl, butyl, or phenyl group, all of which are optionally substituted; and where R and R can form a ring which can contain one or more double bonds and can contain one or more additional carbon atoms;

—N(R)$_2$ where each R, independently of each other R, is a hydrogen, or an alkyl group, or an acyl group or an aryl group or, more specifically, where R is a methyl, ethyl, propyl, butyl, phenyl or acetyl group, all of which are optionally substituted; and where R and R can form a ring which can contain one or more double bonds and can contain one or more additional carbon atoms;

—SR, where R is hydrogen or an alkyl group or an aryl group or, more specifically, where R is hydrogen, methyl, ethyl, propyl, butyl, or a phenyl group, all of which are optionally substituted;

—SO$_2$R, or —SOR where R is an alkyl group or an aryl group or, more specifically, where R is a methyl, ethyl, propyl, butyl, or phenyl group, all of which are optionally substituted;

—OCOOR where R is an alkyl group or an aryl group;

—SO$_2$N(R)$_2$ where each R, independently of each other R, is a hydrogen, an alkyl group, or an aryl group, all of which are optionally substituted, and wherein R and R can form a ring which can contain one or more double bonds and can contain one or more additional carbon atoms;

—OR where R is H, an alkyl group, an aryl group, or an acyl group, all of which are optionally substituted. In a particular example R can be an acyl, yielding —OCOR" where R" is a hydrogen or an alkyl group or an aryl group and more specifically where R" is methyl, ethyl, propyl, butyl, or phenyl groups, all of which are optionally substituted.

Specific substituted alkyl groups include haloalkyl groups, particularly trihalomethyl groups and specifically trifluoromethyl groups. Specific substituted aryl groups include mono-, di-, tri, tetra- and penta-halo-substituted phenyl groups; mono-, di-, tri-, tetra-, penta-, hexa-, and hepta-halo-substituted naphthalene groups; 3- or 4-halo-substituted phenyl groups, 3- or 4-alkyl-substituted phenyl groups, 3- or 4-alkoxy-substituted phenyl groups, 3- or 4-RCO-substituted phenyl, 5- or 6-halo-substituted naphthalene groups. More specifically, substituted aryl groups include acetylphenyl groups, particularly 4-acetylphenyl groups; fluorophenyl groups, particularly 3-fluorophenyl and 4-fluorophenyl groups; chlorophenyl groups, particularly 3-chlorophenyl and 4-chlorophenyl groups; methylphenyl groups, particularly 4-methylphenyl groups; and methoxyphenyl groups, particularly 4-methoxyphenyl groups.

FIG. 1A is a simplified schematic diagram illustrating a visibly transparent photovoltaic device according to an embodiment of the present invention. As illustrated in FIG. 1A, the visibly transparent photovoltaic device 100 includes a number of layers and elements discussed more fully below. As discussed in relation to FIG. 2, visibly transparent indicates that the photovoltaic device absorbs optical energy at wavelengths outside the visible wavelength band of 450 nm to 650 nm, for example, while substantially transmitting visible light inside the visible wavelength band. As illustrated in FIG. 1A, UV and/or NIR light is absorbed in the layers and elements of the photovoltaic device while visible light is transmitted through the device. Thus, the discussion of transparency provided herein should be understood as visible transparency.

Substrate 105, which can be glass or other visibly transparent materials providing sufficient mechanical support to the other layers and structures illustrated, supports optical layers 110 and 112. These optical layers can provide a variety of optical properties, including antireflection (AR) properties, wavelength selective reflection or distributed Bragg reflection properties, index matching properties, encapsulation, or the like. Optical layers may advantageously be visibly transparent. An additional optical layer 114 can be utilized, for example, as an AR coating, an index matching later, a passive infrared or ultraviolet absorption layer, etc. Optionally, optical layers may be transparent to ultraviolet and/or near-infrared light or transparent to at least a subset of wavelengths in the ultraviolet and/or near-infrared bands. Depending on the configuration, additional optical layer 114 may also be a passive visible absorption layer. Example substrate materials include various glasses and rigid or flexible polymers. Multilayer substrates may also be utilized. Substrates may have any suitable thickness to provide the mechanical support needed for the other layers and structures, such as, for example, thicknesses from 1 mm to 20 mm. In some cases, the substrate may be or comprise an adhesive film to allow application of the visibly transparent photovoltaic device 100 to another structure, such as a window pane, display device, etc.

It will be appreciated that, although the devices overall may exhibit visible transparency, such as a transparency in the 450-650 nm range greater than 30%, greater than 40%, greater than 50%, greater than 60%, greater than 70%, or up to or approaching 100%, certain materials taken individually may exhibit absorption in portions of the visible spectrum. Optionally, each individual material or layer in a visibly transparent photovoltaic device has a high transparency in the visible range, such as greater than 30% (i.e., between 30% and 100%). It will be appreciated that transmission or absorption may be expressed as a percentage and may be dependent on the material's absorbance properties, a thickness or path length through an absorbing material, and a concentration of the absorbing material, such that a material with an absorbance in the visible spectral region may still exhibit a low absorption or high transmission if the path length through the absorbing material is short and/or the absorbing material is present in low concentration.

As described herein and below, photoactive materials in various photoactive layers advantageously exhibit minimal absorption in the visible region (e.g., less than 20%, less than 30%, less than 40%, less than 50%, less than 60%, or less than 70%), and instead exhibit high absorption in the near-infrared and/or ultraviolet regions (e.g., an absorption peak of greater than 50%, greater than 60%, greater than 70%, or greater than 80%). For some applications, absorption in the visible region may be as large as 70%. Various configurations of other materials, such as the substrate, optical layers, and buffer layers, may allow these materials to provide overall visible transparency, even though the materials may exhibit some amount of visible absorption. For example, a thin film of a metal may be included in a transparent electrode, such as a metal that exhibits visible absorption, like Ag or Cu; when provided in a thin film configuration, however, the overall transparency of the film may be high. Similarly, materials included in an optical or buffer layer may exhibit absorption in the visible range, but may be provided at a concentration or thickness where the overall amount of visible light absorption is low, providing visible transparency.

The visibly transparent photovoltaic device 100 also includes a set of transparent electrodes 120 and 122 with a photoactive layer 140 positioned between electrodes 120 and 122. These electrodes, which can be fabricated using ITO, thin metal films, or other suitable visibly transparent materials, provide electrical connection to one or more of the various layers illustrated. For example, thin films of copper, silver, or other metals may be suitable for use as a visibly transparent electrode, even though these metals may absorb light in the visible band. When provided as a thin film, however, such as a film having a thickness of 1 nm to 200 nm (e.g., about 5 nm, about 10 nm, about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 105 nm, about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, or about 195 nm), an overall transmittance of the thin film in the visible band may remain high, such as greater than 30%, greater than 40%, greater than 50%, greater than 60%, greater than 70%, greater than 80%, or greater than 90%. Advantageously, thin metal films, when used as transparent electrodes, may exhibit lower absorption in the ultraviolet band than other semiconducting materials that may be useful as a transparent electrode, such as ITO, as some semiconducting transparent conducting oxides exhibit a band gap that occurs in the ultraviolet band and thus are highly absorbing or opaque to ultraviolet light. In some cases, however, an ultraviolet absorbing transparent electrode may be used, such as to screen at least a portion of the ultraviolet light from underlying components, as ultraviolet light may degrade certain materials.

A variety of deposition techniques may be used to generate a transparent electrode, including vacuum deposition techniques, such as atomic layer deposition, chemical vapor deposition, physical vapor deposition, thermal evaporation, sputter deposition, epitaxy, etc. Solution based deposition techniques, such as spin-coating, may also be used in some cases. In addition, transparent electrodes may be patterned using techniques known in the art of microfabrication, including lithography, lift off, etching, etc.

Buffer layers 130 and 132 and photoactive layer 140 are utilized to implement the electrical and optical properties of the photovoltaic device. These layers can be layers of a single material or can include multiple sub-layers as appropriate to the particular application. Thus, the term "layer" is not intended to denote a single layer of a single material, but can include multiple sub-layers of the same or different materials. In some embodiments, buffer layer 130, photoactive layer(s) 140 and buffer layer 132 are repeated in a stacked configuration to provide tandem device configurations, such as including multiple heterojunctions. In some embodiments, the photoactive layer(s) include electron donor materials and electron acceptor materials, also referred to as donors and acceptors. These donors and acceptors are visibly transparent, but absorb outside the visible wavelength band to provide the photoactive properties of the device.

Useful buffer layers include those that function as electron transport layers, electron blocking layers, hole transport layers, hole blocking layers, exciton blocking layers, optical spacers, physical buffer layers, charge recombination layers, or charge generation layers. Buffer layers may exhibit any suitable thickness to provide the buffering effect desired and may optionally be present or absent. Useful buffer layers, when present, may have thicknesses from 1 nm to 1 μm. Various materials may be used as buffer layers, including fullerene materials, carbon nanotube materials, graphene materials, metal oxides, such as molybdenum oxide, titanium oxide, zinc oxide, etc., polymers, such as poly(3,4-ethylenedioxythiophene), polystyrene sulfonic acid, polyaniline, etc., copolymers, polymer mixtures, and small molecules, such as bathocuproine. Buffer layers may be applied using a deposition process (e.g., thermal evaporation) or a solution processing method (e.g., spin coating).

Figure 1B:
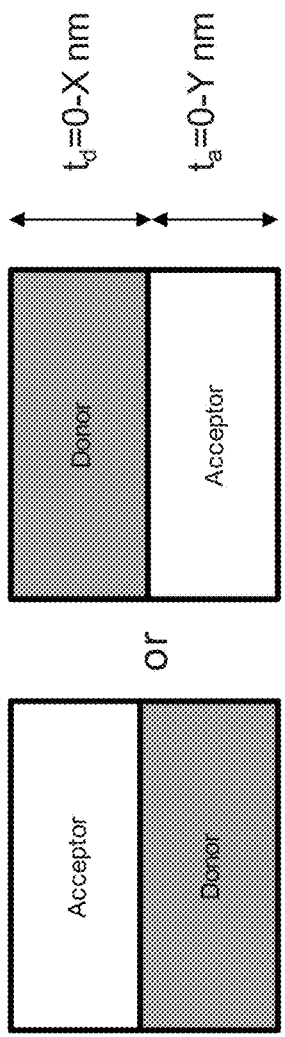
FIG. 1B provides an overview of various configurations of photoactive layer(s) in visibly transparent photovoltaic devices according to embodiments of the present invention.
Figure 1B:
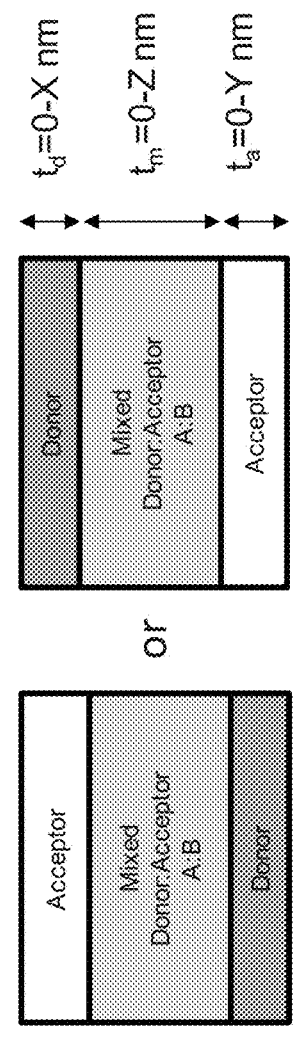
Figure 1B:
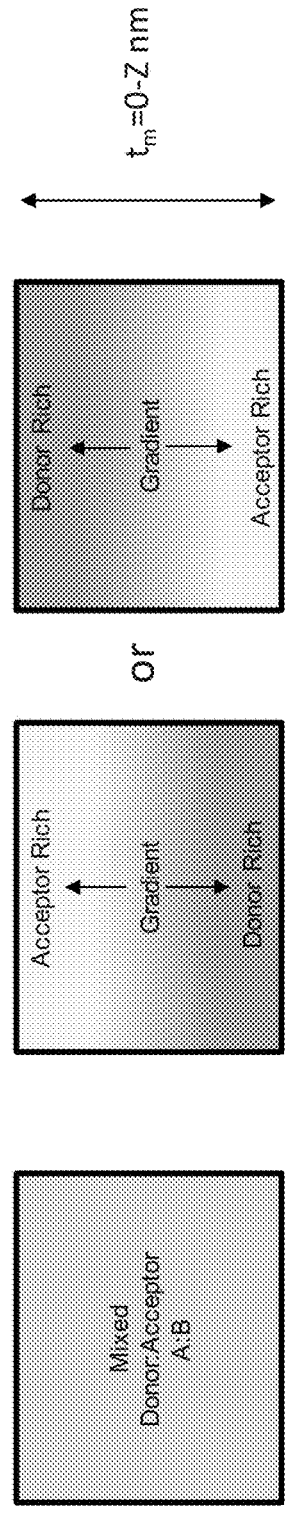

FIG. 1B depicts an overview of various example single junction configurations for photoactive layer 140. Photoactive layer 140 may optionally correspond to mixed donor/acceptor (bulk heterojunction) configurations, planar donor/acceptor configurations, planar and mixed donor/acceptor configurations, or gradient donor/acceptor configurations. Various materials may be used as the photoactive layers 140, such as materials that absorb in the ultraviolet band or the near-infrared band but that only absorb minimally, if at all, in the visible band. In this way, the photoactive material may be used to generate electron-hole pairs for powering an external circuit by way of ultraviolet and/or near-infrared absorption, leaving the visible light relatively unperturbed to provide visible transparency. As illustrated, photoactive layer 140 may comprise a planar heterojunction including separate donor and acceptor layers. Photoactive layer 140 may alternatively comprise a planar-mixed heterojunction structure including separate acceptor and donor layers and a mixed donor-acceptor layer. Photoactive layer 140 may alternatively comprise a mixed heterojunction structure including a fully mixed acceptor-donor layer or those including a mixed donor-acceptor layer with various relative concentration gradients.

Photoactive layers may have any suitable thickness and may have any suitable concentration or composition of photoactive materials to provide a desired level of transparency and ultraviolet/near-infrared absorption characteristics. Example thicknesses of a photoactive layer may range from about 1 nm to about 1 μm, about 1 nm to about 300 nm, or about 1 nm to about 100 nm. In some cases, photoactive layers may be made up of individual sub-layers or mixtures of layers to provide suitable photovoltaic power generation characteristics, as illustrated in FIG. 1B. The various configurations depicted in FIG. 1B may be used and dependent on the particular donor and acceptor materials used in order to provide advantageous photovoltaic power generation. For example, some donor and acceptor combinations may benefit from particular configurations, while other donor and acceptor combinations may benefit from other particular configurations. Donor materials and acceptor materials may be provided in any ratio or concentration to provide suitable photovoltaic power generation characteristics. For mixed layers, the relative concentration of donors to acceptors is optionally between about 20 to 1 and about 1 to 20. Optionally, the relative concentration of donors to acceptors is optionally between about 5 to 1 and about 1 to 5. Optionally, donors and acceptors are present in a 1 to 1 ratio.

It will be appreciated that, in various embodiments, visibly transparent photovoltaic device 100 comprises transparent electrode 120, photoactive layer 140 and transparent electrode 122, and that any one or more of substrate 105, optical layers 110, 112, and 114, and buffer layers 130 and 132 may be optionally included or excluded.

As described more fully herein, embodiments of the present invention employ visibly transparent metal dithiolate compounds for one or more of the buffer layers, optical layers, and/or the photoactive layers. These compounds can include suitably functionalized versions for modification of the electrical and/or optical properties of the core structure. As an example, the disclosed compounds can include functional groups that decrease the absorption properties in the visible wavelength band between 450 nm to 650 nm and increase the absorption properties in the NIR band at wavelengths greater than 650 nm.

As an example, the disclosed visibly transparent photoactive compounds are useful as an electron donor photoactive material, in some embodiments, and may be paired with suitable electron acceptor photoactive materials in order to provide a useful photoactive layer in the photovoltaic device. Optionally, the disclosed visibly transparent photoactive compounds are useful as an electron acceptor photoactive material, and may be paired with suitable electron donor photoactive materials in order to provide a useful photoactive layer in the photovoltaic device. Example donor and acceptor materials are described in U.S. Provisional Application Nos. 62/521,154, 62/521,158, 62/521,160, 62/521,211, 62/521,214, and 62/521,224, each filed on Jun. 16, 2017, which are hereby incorporated by reference in their entireties.

In embodiments, the chemical structure of the disclosed photoactive compounds can be functionalized with one or more directing groups, such as electron donating groups, electron withdrawing groups, or substitutions about or to a core metal atom, in order to provide desirable electrical characteristics to the material. For example, in some embodiments, the photoactive compounds are functionalized with amine groups, phenol groups, alkyl groups, phenyl groups, or other electron donating groups to improve the ability of the material to function as an electron donor in a photovoltaic device. As another example, in some embodiments, the photoactive compounds are functionalized with cyano groups, halogens, sulfonyl groups, or other electron withdrawing groups to improve the ability of the material to function as an electron acceptor in a photovoltaic device.

In embodiments, the photoactive compounds are functionalized to provide desirable optical characteristics. For example, in some embodiments, the photoactive compounds may be functionalized with an extended conjugation to redshift the absorption profile of the material. It will be appreciated that conjugation may refer to a delocalization of pi electrons in a molecule and may be characterized by alternating single and multiple bonds in a molecular structure. For example, functionalizations that extend the electron conjugation may include fusing one or more aromatic groups to the molecular structure of the material. Other functionalizations that may provide extended conjugation include alkene functionalization, such as by a vinyl group, aromatic or heteroaromatic functionalization, carbonyl functionalization, such as by an acyl group, sulfonyl functionalization, nitro functionalization, cyano functionalization, etc. It will be appreciated that various molecular functionalizations may impact both the optical and the electrical properties of the photoactive compounds.

It will be appreciated that device function may be impacted by the morphology of the active layers in the solid state. Separation of electron donors and acceptors into discrete domains, with dimensions on the scale of the exciton diffusion length and large interfacial areas, can be advantageous for achieving high device efficiency. Advantageously, the molecular framework of the photoactive materials can be tailored to control the morphology of the materials. For example, the introduction of functional groups as described herein can have large impacts to the morphology of the material in the solid state, regardless of whether such modifications impact the energetics or electronic properties of the material. Such morphological variations can be observed in pure materials and when a particular material is blended with a corresponding donor or acceptor. Useful functionalities to control morphology include, but are not limited to, addition of alkyl chains, conjugated linkers, fluorinated alkanes, bulky groups (e.g., tert-butyl, phenyl, naphthyl or cyclohexyl), as well as more complex coupling procedures designed to force parts of the structure out of the plane of the molecule to inhibit excessive crystallization.

In embodiments, other molecular structural characteristics may provide desirable electrical and optical properties in the photoactive compounds. For example, in some embodiments, the photoactive compounds may exhibit portions of the molecule that may be characterized as electron donating while other portions of the molecule may be characterized as electron accepting. Without wishing to be bound by any theory, molecules including alternating electron donating and electron accepting portions may result in redshifting the absorption characteristics of the molecule as compared to similar molecules lacking alternating electron donating and electron accepting portions. For example, alternating electron donating and electron accepting portions may decrease or otherwise result in a lower energy gap between a highest occupied molecular orbital and a lowest unoccupied molecular orbital. Organic donor and/or acceptor groups may be useful as R-group substituents, such as on any aryl, aromatic, heteroaryl, heteroaromatic, alkyl, or alkenyl group, in the visibly transparent photoactive compounds described herein.

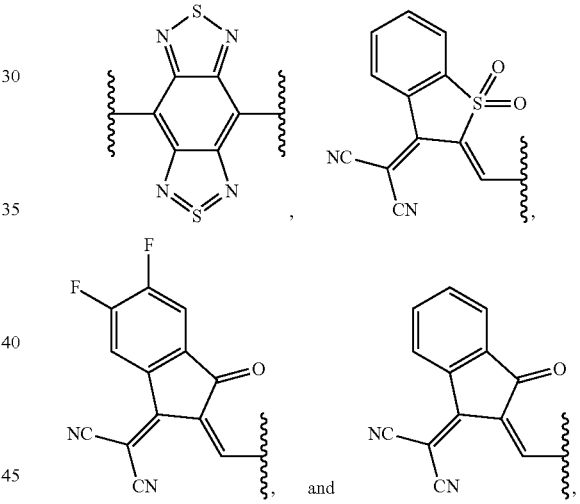

which may be considered strong acceptor groups. Example organic acceptor groups include:

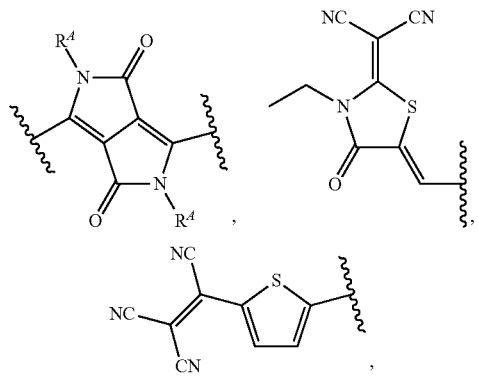

-continued

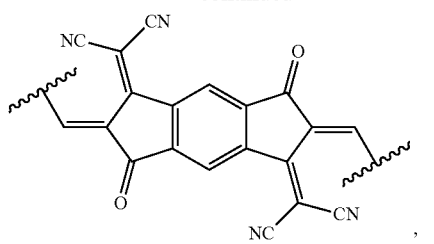

, and

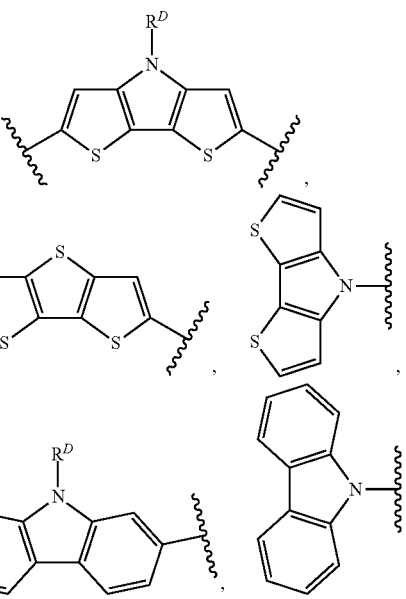

, which may be considered moderate acceptor groups. Example organic acceptor groups include:

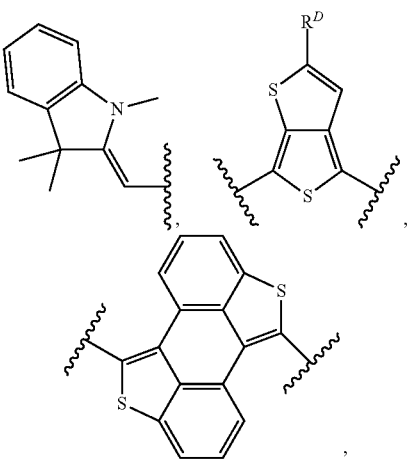

, and

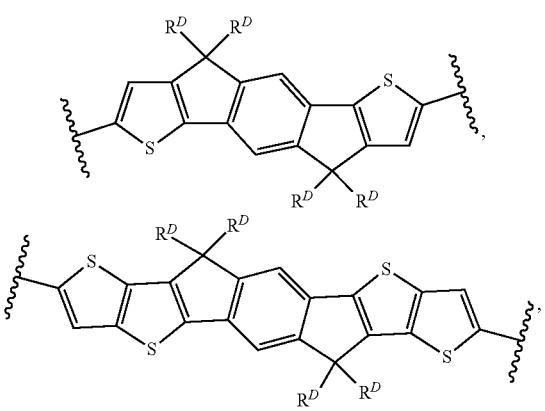

which may be considered weaker acceptor groups. For the illustrated organic acceptor groups, $R^4$ may optionally be hydrogen or alkyl, for example. Further, the wavy lines represent positions at which the illustrated structure is connected to another substructure.

Example organic donor groups include:

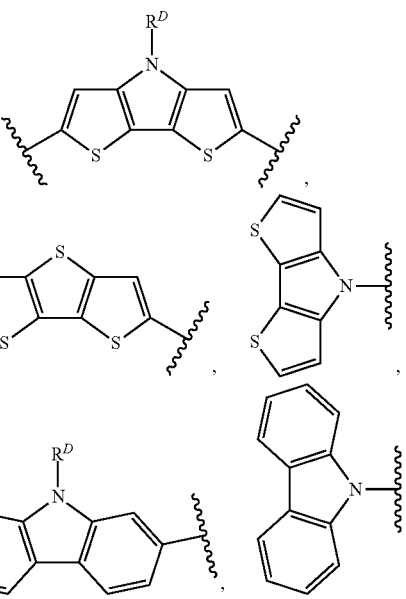

which may be considered strong donor groups. Example organic donor groups include:

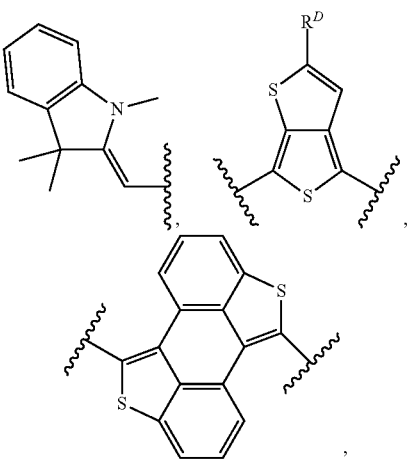

which may be considered moderate donor groups. Example organic donor groups include:

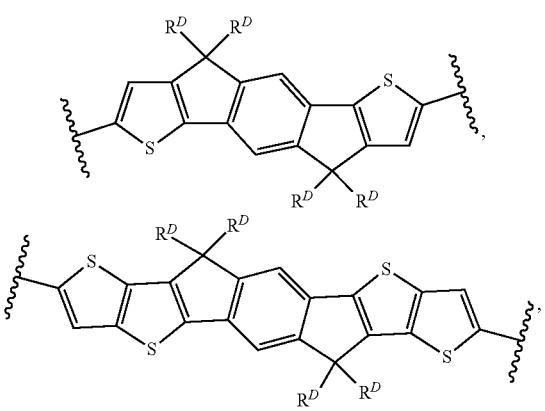

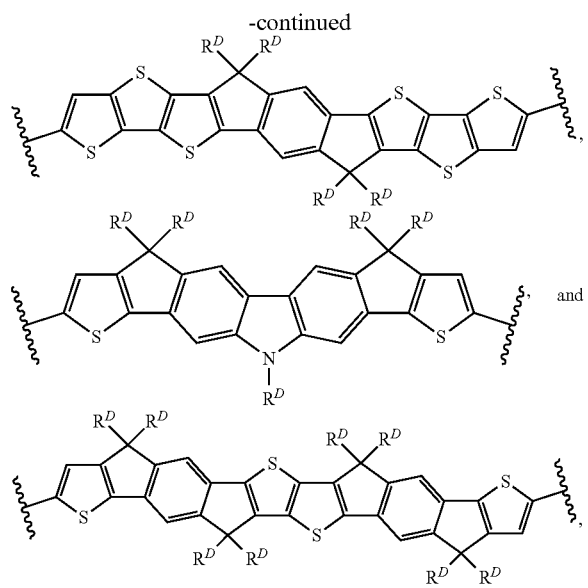

which may be considered weaker donor groups. For the illustrated organic donor groups, $R^D$ may optionally be hydrogen or alkyl, for example. Further, the wavy lines represent positions at which the illustrated structure is connected to another substructure.

In embodiments, the photoactive compounds may exhibit symmetric structures, such as structures having two or more points of symmetry. Symmetric structures may include those where a core group, such as a metal dithiolate complex, is functionalized on opposite sides by the same groups, or where two of the same core groups are fused or otherwise bonded to one another. In other embodiments, the photoactive compounds may exhibit asymmetric structures, such as structures having fewer than two points of symmetry. Asymmetric structures may include those where a core group, such as a metal dithiolate complex, is functionalized on opposite sides by different groups or where two different core groups are fused or otherwise bonded to one another.

When the materials described herein are incorporated as a photoactive layer in a transparent photovoltaic device as either an electron donor or electron acceptor, the layer thicknesses can be controlled to vary device output, absorbance, or transmittance. For example, increasing the donor or acceptor layer thickness can increase the light absorption in that layer. In some cases, increasing a concentration of donor/acceptor materials in a donor or acceptor layer may similarly increase the light absorption in that layer. However, in some embodiments, a concentration of donor/acceptor materials may not be adjustable, such as when active material layers comprise pure or substantially pure layers of donor/acceptor materials or pure or substantially pure mixtures of donor/acceptor materials. Optionally, donor/acceptor materials may be provided in a solvent or suspended in a carrier, such as a buffer layer material, in which case the concentration of donor/acceptor materials may be adjusted. In some embodiments, the donor layer concentration is selected where the current produced is maximized. In some embodiments, the acceptor layer concentration is selected where the current produced is maximized.

However, the charge collection efficiency can decrease with increasing donor or acceptor thickness due to the increased "travel distance" for the charge carriers. Therefore, there may be a trade-off between increased absorption and decreasing charge collection efficiency with increasing layer thickness. It can thus be advantageous to select materials as described herein that have a high absorption coefficient and/or concentration to allow for increased light absorption per thickness. In some embodiments, the donor layer thickness is selected where the current produced is maximized. In some embodiments, the acceptor layer thickness is selected where the current produced is maximized.

In addition to the individual photoactive layer thicknesses formed from materials described herein, the thickness and composition of the other layers in the transparent photovoltaic device can also be selected to enhance absorption within the photoactive layers. The other layers (buffer layers, electrodes, etc.), are typically selected based on their optical properties (index of refraction and extinction coefficient) in the context of the thin film device stack and resulting optical cavity. For example, a near-infrared absorbing photoactive layer can be positioned in the peak of the optical field for the near-infrared wavelengths where it absorbs to maximize absorption and resulting current produced by the device. This can be accomplished by spacing the photoactive layer at an appropriate distance from the electrode using a second photoactive layer and/or optical layers as spacer. A similar scheme can be used for ultraviolet absorbing photoactive layers. In many cases, the peaks of the longer wavelength optical fields will be positioned further from the more reflective of the two transparent electrodes compared to the peaks of the shorter wavelength optical fields. Thus, when using separate donor and acceptor photoactive layers, the donor and acceptor can be selected to position the more red absorbing (longer wavelength) material further from the more reflective electrode and the more blue absorbing (shorter wavelength) closer to the more reflective electrode.

In some embodiments, optical layers may be included to increase the intensity of the optical field at wavelengths where the donor absorbs in the donor layer to increase light absorption and hence, increase the current produced by the donor layer. In some embodiments, optical layers may be included to increase the intensity of the optical field at wavelengths where the acceptor absorbs in the acceptor layer to increase light absorption and hence, increase the current produced by the acceptor layer. In some embodiments, optical layers may be used to improve the transparency of the stack by either decreasing visible absorption or visible reflection. Further, the electrode material and thickness may be selected to enhance absorption outside the visible range within the photoactive layers, while preferentially transmitting light within the visible range.

Optionally, enhancing spectral coverage of a visibly transparent photovoltaic device is achieved by the use of a multi-cell series stack of visibly transparent photovoltaic devices, referred to as tandem cells, which may be included as multiple stacked instances of buffer layer 130, photoactive layer 140, and buffer layer 132, as described with reference to FIG. 1A. This architecture includes more than one photoactive layer, which are typically separated by a combination of buffer layer(s) and/or thin metal layers, for example. In this architecture, the currents generated in each subcell flow in series to the opposing electrodes and therefore, the net current in the cell is limited by the smallest current generated by a particular subcell, for example. The open circuit voltage (VOC) is equal to the sum of the VOCs of the subcells. By combining sub-cells fabricated with different donor-acceptors pairs which absorb in different regions of the solar spectrum, a significant improvement in efficiency relative to a single junction cell can be achieved.

Additional description related to the materials utilized in one or more of the buffer layers and the photoactive layers, including donor layers and/or acceptor layers, are provided below.

Figure 2:
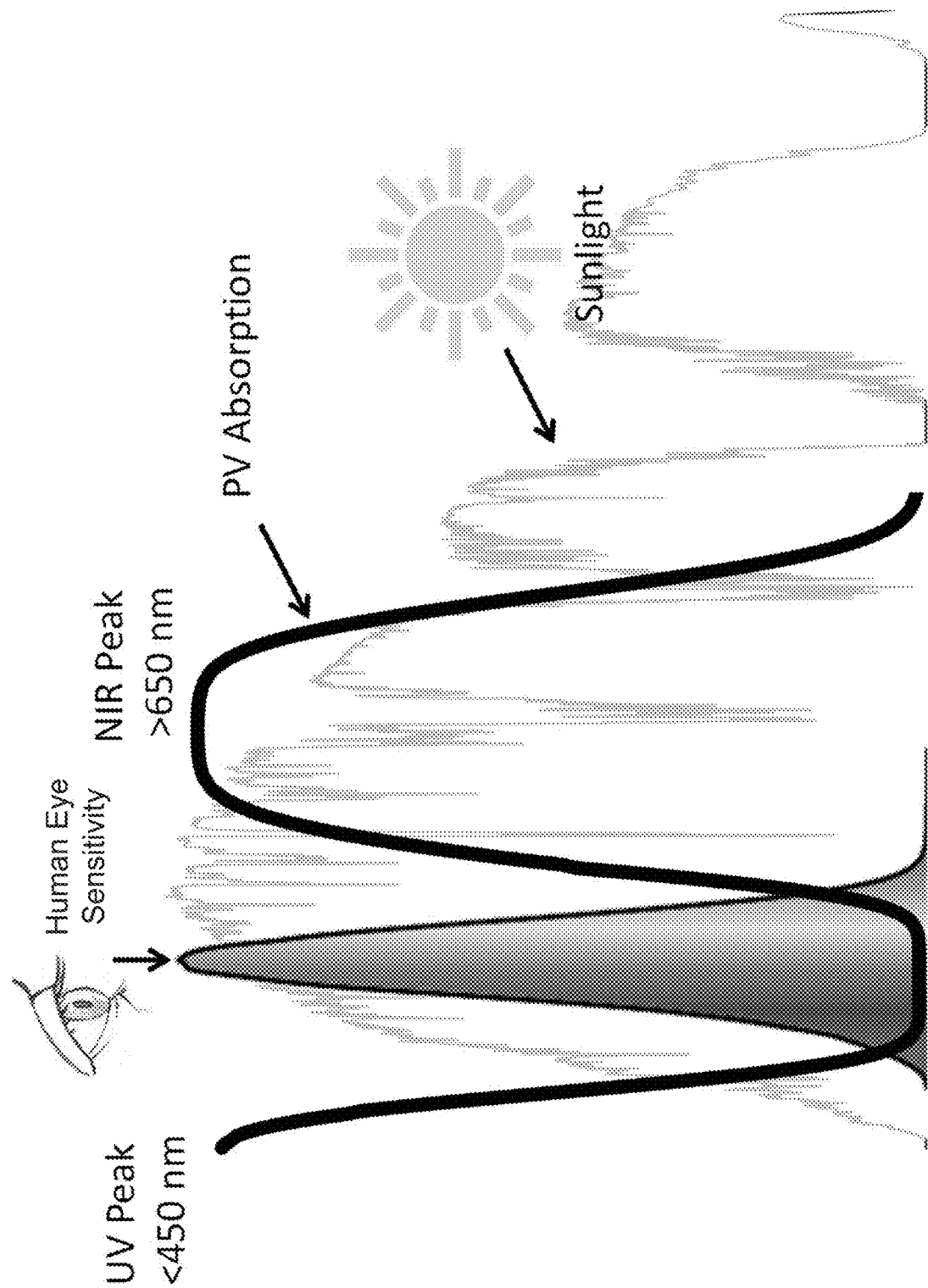
FIG. 2 is simplified plot illustrating the solar spectrum, human eye sensitivity, and exemplary transparent photovoltaic device absorption as a function of wavelength.

FIG. 2 is simplified plot illustrating the solar spectrum, human eye sensitivity, and exemplary visibly transparent photovoltaic device absorption as a function of wavelength. As illustrated in FIG. 2, embodiments of the present invention utilize photovoltaic structures that have low absorption in the visible wavelength band between about 450 nm and about 650 nm, but absorb in the UV and NIR bands, i.e., outside the visible wavelength band, enabling visibly transparent photovoltaic operation. The ultraviolet band or ultraviolet region may be described, in embodiments, as wavelengths of light of between about 200 nm and 450 nm. It will be appreciated that useful solar radiation at ground level may have limited amounts of ultraviolet less than about 280 nm and, thus, the ultraviolet band or ultraviolet region may be described as wavelengths of light of between about 280 nm and 450 nm, in some embodiments. The near-infrared band or near-infrared region may be described, in embodiments, as wavelengths of light of between about 650 nm and 1400 nm. Various compositions described herein may exhibit absorption including a NIR peak with a maximum absorption strength in the visible region that is smaller than that in the NIR region.

Figure 3:
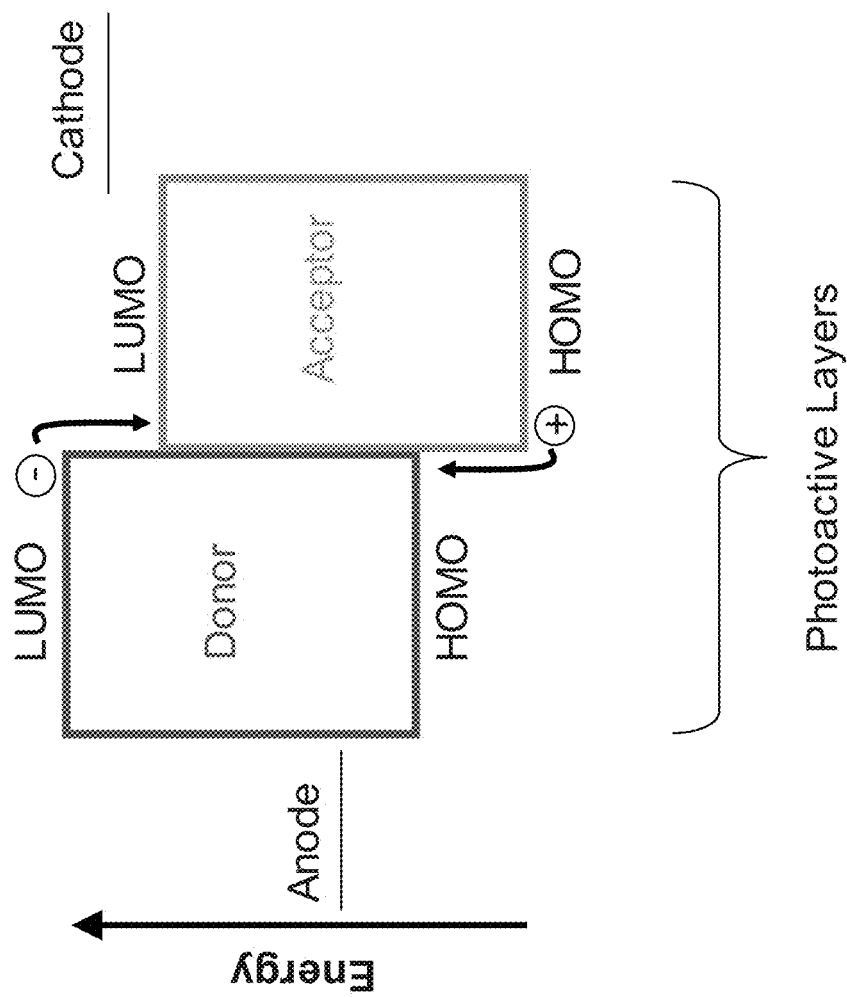
FIG. 3 is a simplified energy level diagram for a visibly transparent photovoltaic device according to an embodiment of the present invention.

FIG. 3 provides a schematic energy level diagram overview for operation of an example organic photovoltaic device, such as visibly transparent photovoltaic device 100. For example, in such a photovoltaic device, various photoactive materials may exhibit electron donor or electron acceptor characteristics, depending on their molecular properties and the types of materials that are used for buffer layers, electrodes, etc. As depicted in FIG. 3, each of the donor and acceptor materials have a highest occupied molecular orbital (HOMO) and a lowest unoccupied molecular orbital (LUMO). A transition of an electron from the HOMO to the LUMO may be imparted by absorption of photons. The energy between the HOMO and the LUMO (the HOMO-LUMO gap) of a material represents approximately the energy of the optical band gap of the material. For the electron donor and electron acceptor materials useful with the transparent photovoltaic devices provided herein, the HOMO-LUMO gap for the electron donor and electron acceptor materials preferably falls outside the energy of photons in the visible range. For example, the HOMO-LUMO gap may be in the ultraviolet region or the near-infrared region, depending on the photoactive materials. It will be appreciated that the HOMO is comparable to the valence band in conventional conductors or semiconductors, while the LUMO is comparable to the conduction band in conventional conductors or semiconductors.

The narrow absorption spectrum of many organic molecules, such as organic semiconductors, can make it difficult to absorb the entire absorption spectra using a single molecular species. Therefore, electron donor and acceptor molecules are generally paired to afford a complementary absorption spectrum and increase spectral coverage of light absorption. Additionally, the donor and acceptor molecules are selected such that their energy levels (HOMO and LUMO) lie favorably with respect to one another. The difference in the LUMO level of donor and acceptor provides a driving force for dissociation of electron-hole pairs (excitons) created on the donor whereas the difference in the HOMO levels of donor and acceptors provides driving force for dissociation of electron-hole pairs (excitons) created on the acceptor. In some embodiments, it may be useful for the acceptor to have high electron mobility to efficiently transport electrons to an adjacent buffer layer. In some embodiments, it may be useful for the donor to have high hole mobility to efficiently transport holes to the buffer layer. Additionally, in some embodiments, it may be useful to increase the difference in the LUMO level of the acceptor and HOMO level of the donor to increase the open circuit voltage (VOC), since VOC has been shown to be directly proportional to the difference between LUMO of the acceptor and HOMO of the donor. Such donor-acceptor pairings within the photoactive layer may be accomplished by appropriately pairing one of the materials described herein with a complementary material, which could be a different visibly transparent photoactive compound described herein or a completely separate material system, as described below with reference to FIG. 6.

The buffer layer adjacent to the donor, generally referred to as the anode buffer layer or hole transport layer, is selected such that HOMO level or valence band (in the case of inorganic materials) of the buffer layer is aligned in the energy landscape with the HOMO level of the donor to transport holes from the donor to the anode (transparent electrode). In some embodiments, it may be useful for the buffer layer to have high hole mobility. The buffer layer adjacent to the acceptor, generally referred to as the cathode buffer layer or electron transport layer, is selected such that LUMO level or conduction band (in the case of inorganic materials) of the buffer layer is aligned in the energy landscape with the LUMO level of the acceptor to transport electrons from the acceptor to the cathode (transparent electrode). In some embodiments, it may be useful for the buffer layer to have high electron mobility.

Figure 4A:
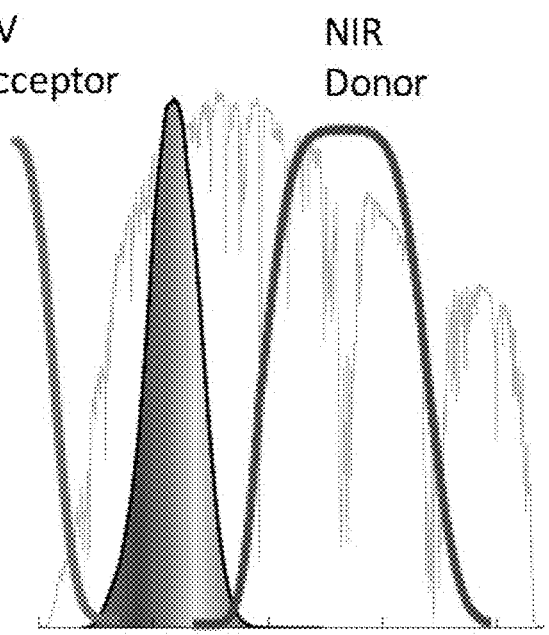
FIG. 4A, FIG. 4B, FIG. 4C, and FIG. 4D provide plots showing example absorption profiles for different electron acceptor and donor configurations, which can comprise the photoactive layers.
Figure 4B:
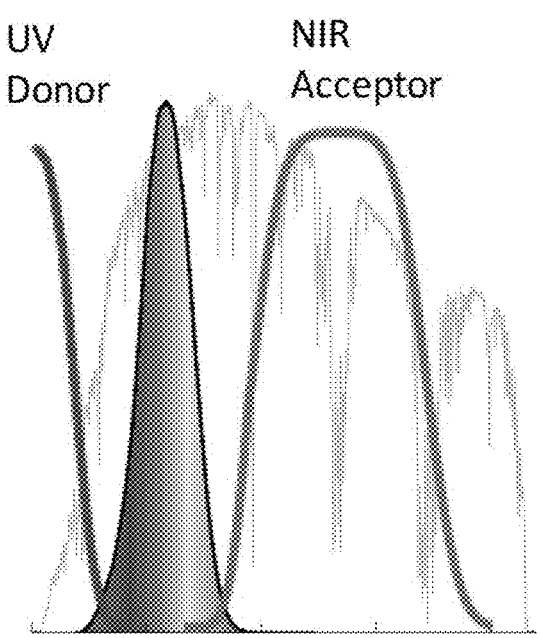

FIG. 4A, FIG. 4B, FIG. 4C, and FIG. 4D provide plots showing example absorption bands for different electron donor and electron acceptor configurations useful with visibly transparent photovoltaic devices. In FIG. 4A, the donor material exhibits absorption in the NIR, while the acceptor material exhibits absorption in the UV. FIG. 4B depicts the opposite configuration, where the donor material exhibits absorption in the UV, while the acceptor material exhibits absorption in the NIR.

Figure 4C:
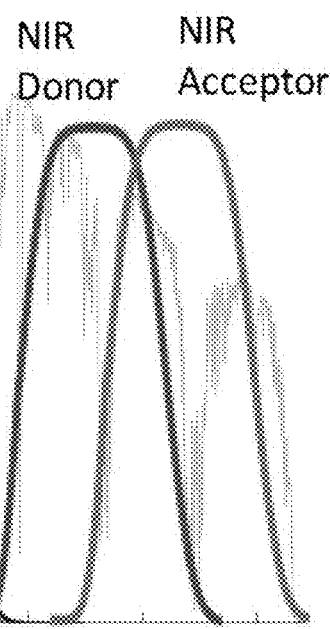
Figure 4D:
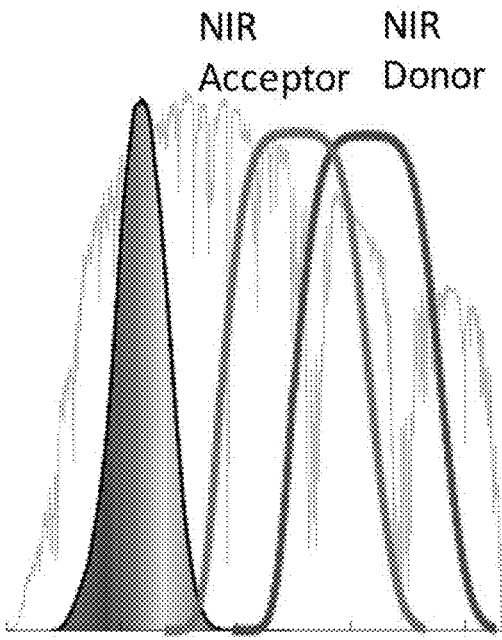

FIG. 4C depicts an additional configuration, where both the donor and acceptor materials exhibit absorption in the NIR. As illustrated in the figures, the solar spectrum exhibits significant amounts of useful radiation in the NIR with only relatively minor amounts in the ultraviolet, making the configuration depicted in FIG. 4C useful for capturing a large amount of energy from the solar spectrum. It will be appreciated that other embodiments are contemplated where both the donor and acceptor materials exhibit absorption in the NIR, such as depicted in FIG. 4D where the acceptor is blue shifted relative to the donor, opposite the configuration depicted in FIG. 4C, where the donor is blue shifted relative to the acceptor.

Figure 5:
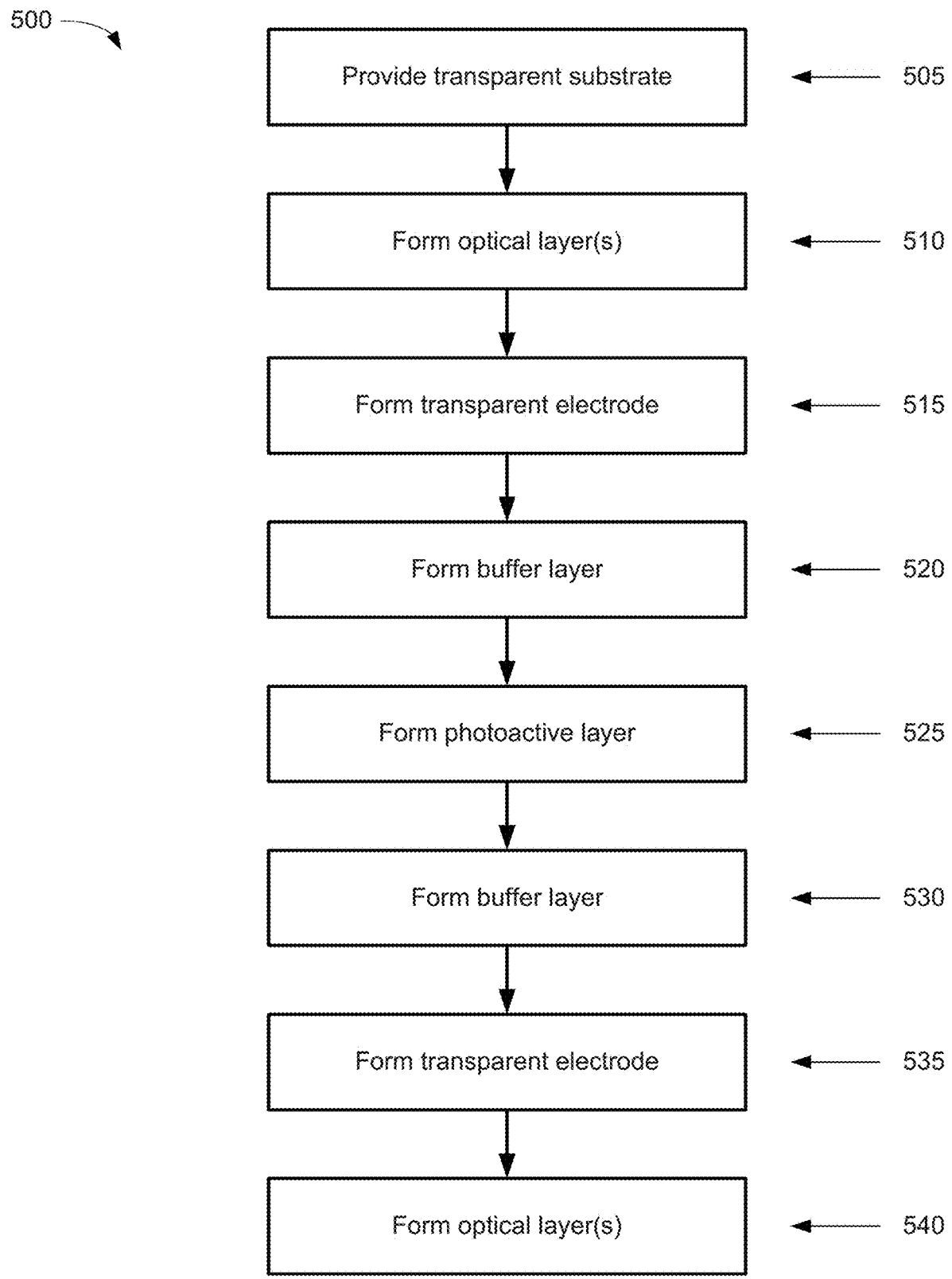
FIG. 5 provides an overview of a method of making visibly transparent photovoltaic devices according to embodiments of the present invention.

The present invention also provides methods for making visibly transparent photovoltaic devices, such as visibly transparent photovoltaic device 100. For example, FIG. 5 provides an overview of a method 500 for making a visibly transparent photovoltaic device in accordance with some embodiments. Method 500 begins at block 505, where a transparent substrate is provided. It will be appreciated that useful transparent substrates include visibly transparent substrates, such as glass, plastic, quartz, and the like. Flexible and rigid substrates are useful with various embodiments. Optionally, the transparent substrate is provided with one or more optical layers preformed on top and/or bottom surfaces.

At block 510, one or more optical layers are optionally formed on or over the transparent substrate, such as on top and/or bottom surfaces of the transparent substrate. Optionally, the one or more optical layers are formed on other materials, such as an intervening layer or material, such as a transparent conductor. Optionally, the one or more optical layers are positioned adjacent to and/or in contact with the visibly transparent substrate. It will be appreciated that formation of optical layers is optional, and some embodiments may not include optical layers adjacent to and/or in contact with the transparent substrate. Optical layers may be formed using a variety of methods including, but not limited to, one or more chemical deposition methods, such as plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition. It will be appreciated that useful optical layers include visibly transparent optical layers. Useful optical layers include those that provide one or more optical properties including, for example, antireflection properties, wavelength selective reflection or distributed Bragg reflection properties, index matching properties, encapsulation, or the like. Useful optical layers may optionally include optical layers that are transparent to ultraviolet and/or near-infrared light. Depending on the configuration, however, some optical layers may optionally provide passive infrared and/or ultraviolet absorption. Optionally, an optical layer may include a visibly transparent photoactive compound described herein.

At block 515, a transparent electrode is formed. As described above, the transparent electrode may correspond to an indium tin oxide thin film or other transparent conducting film, such as thin metal films (e.g., Ag, Cu, etc.), multilayer stacks comprising thin metal films (e.g., Ag, Cu, etc.) and dielectric materials, or conductive organic materials (e.g., conducting polymers, etc.). It will be appreciated that transparent electrodes include visibly transparent electrodes. Transparent electrodes may be formed using one or more deposition processes, including vacuum deposition techniques, such as atomic layer deposition, chemical vapor deposition, physical vapor deposition, thermal evaporation, sputter deposition, epitaxy, etc. Solution based deposition techniques, such as spin-coating, may also be used in some cases. In addition, transparent electrodes may be patterned by way of microfabrication techniques, such as lithography, lift off, etching, etc.

At block 520, one or more buffer layers are optionally formed, such as on the transparent electrode. Buffer layers may be formed using a variety of methods including, but not limited to, one or more chemical deposition methods, such as a plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition. It will be appreciated that useful buffer layers include visibly transparent buffer layers. Useful buffer layers include those that function as electron transport layers, electron blocking layers, hole transport layers, hole blocking layers, optical spacers, physical buffer layers, charge recombination layers, or charge generation layers. In some cases, the disclosed visibly transparent photoactive compounds may be useful as a buffer layer material. For example, a buffer layer may optionally include a visibly transparent photoactive compound described herein.

At block 525, one or more photoactive layers are formed, such as on a buffer layer or on a transparent electrode. As described above, photoactive layers may comprise electron acceptor layers and electron donor layers or co-deposited layers of electron donors and acceptors. Useful photoactive layers include those comprising the visibly transparent photoactive compounds described herein. Photoactive layers may be formed using a variety of methods including, but not limited to, one or more chemical deposition methods, such as a plating, chemical solution deposition, spin coating, dip coating, chemical vapor deposition, plasma enhanced chemical vapor deposition, and atomic layer deposition, or one or more physical deposition methods, such as thermal evaporation, electron beam evaporation, molecular beam epitaxy, sputtering, pulsed laser deposition, ion beam deposition, and electrospray deposition.

In some examples, visibly transparent photoactive compounds useful for photoactive layers may be deposited using a vacuum deposition technique, such as thermal evaporation. Vacuum deposition may take place in a vacuum chamber, such as at pressures of between about $10^{-5}$ Torr and about $10^{-8}$ Torr. In one example, vacuum deposition may take place at a pressure of about $10^{-7}$ Torr. As noted above, various deposition techniques may be applied. In some embodiments, thermal evaporation is used. Thermal evaporation may include heating a source of the material (i.e., the visibly transparent photoactive compound) to be deposited to a temperature of between 200° C. and 500° C. The temperature of the source of material may be selected so as to achieve a thin film growth rate of between about 0.01 nm/s and about 1 nm/s. For example, a thin film growth rate of 0.1 nm/s may be used. These growth rates are useful to generate thin films having thicknesses of between about 1 nm and 500 nm over the course of minutes to hours. It will be appreciated that various properties (e.g., the molecular weight, volatility, thermal stability) of the material being deposited may dictate or influence the source temperature or maximum useful source temperature. For example, a thermal decomposition temperature of the material being deposited may limit the maximum temperature of the source. As another example, a material being deposited that is highly volatile may require a lower source temperature to achieve a target deposition rate as compared to a material that is less volatile, where a higher source temperature may be needed to achieve the target deposition rate. As the material being deposited is evaporated from the source, it may be deposited on a surface (e.g., substrate, optical layer, transparent electrode, buffer layer, etc.) at a lower temperature. For example the surface may have a temperature from about 10° C. to about 100° C. In some cases, the temperature of the surface may be actively controlled. In some cases, the temperature of the surface may not be actively controlled.

At block 530, one or more buffer layers are optionally formed, such as on the photoactive layer. The buffer layers formed at block 530 may be formed similar to those formed at block 520. It will be appreciated that blocks 520, 525, and 530 may be repeated one or more times, such as to form a multilayer stack of materials including a photoactive layer and, optionally, various buffer layers.

At block 535, a second transparent electrode is formed, such as on a buffer layer or on a photoactive layer. Second transparent electrode may be formed using techniques applicable to formation of first transparent electrode at block 515.

At block 540, one or more additional optical layers are optionally formed, such as on the second transparent electrode.

It should be appreciated that the specific steps illustrated in FIG. 5 provide a particular method of making a visibly transparent photovoltaic device according to various embodiments of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. It will be appreciated that many variations, modifications, and alternatives may be used.

Method 500 may optionally be extended to correspond to a method for generating electrical energy. For example, a method for generating electrical energy may comprise providing a visibly transparent photovoltaic device, such as by making a visibly transparent photovoltaic device according to method 500. Methods for generating electrical energy may further comprise exposing the visibly transparent photovoltaic device to visible, ultraviolet and/or near-infrared light to drive the formation and separation of electron-hole pairs, as described above with reference to FIG. 3, for example, for generation of electrical energy. The visibly transparent photovoltaic device may include the visibly transparent photoactive compounds described herein as photoactive materials, buffer materials, and/or optical layers.

Figure 6:
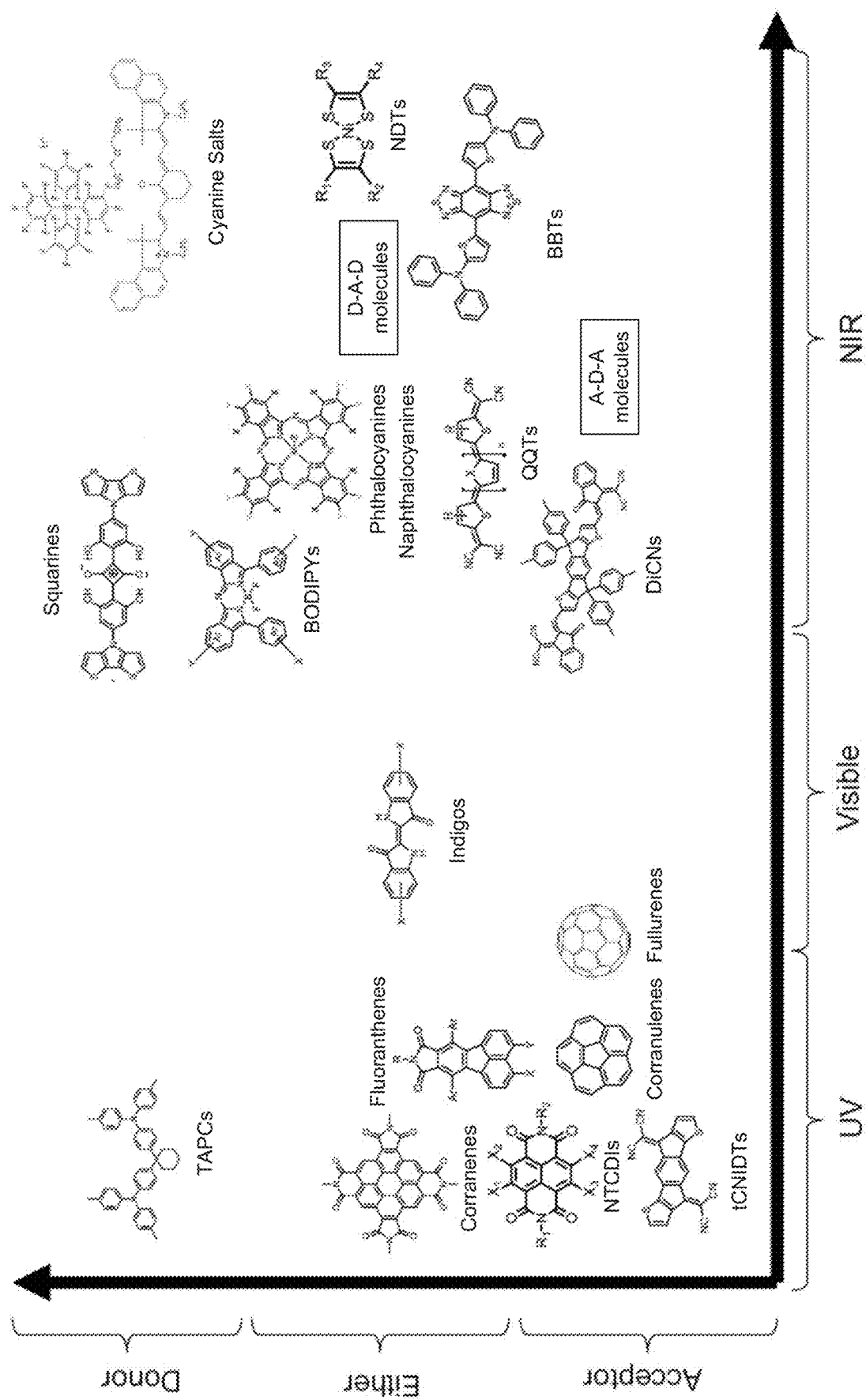
FIG. 6 provides a plot showing general absorption characteristics and donor/acceptor behavior for different classes of organic molecules.

FIG. 6 provides a plot showing general absorption characteristics and donor/acceptor behavior for different classes of photoactive compounds. Useful visibly transparent photoactive layers in visibly transparent photovoltaic devices may include one or more photoactive compounds of the different classes illustrated. For example, photoactive compounds described herein may be incorporated into a visibly transparent photoactive layer as a donor or acceptor compound along with another photoactive compound of the classes depicted in FIG. 6. As an example, if a photoactive compound is used as an electron donor photoactive material, it may be paired with an electron acceptor photoactive material from the classes illustrated in FIG. 6 as a counterpart in order to provide a useful photoactive layer in the photovoltaic device. Similarly, if a photoactive compound is used as an electron acceptor photoactive material, it may be paired with an electron donor photoactive material from the classes illustrated in FIG. 6 as a counterpart in order to provide a useful photoactive layer in the photovoltaic device. As an example, TAPC, or a derivative thereof, may be used as a UV absorbing electron donor. As another example, fullerenes or fullerene derivatives may optionally be used as a UV absorbing electron acceptor. As another example, a cyanine salt may be used as a near-infrared absorbing electron donor. As another example, a molecule with a donor-acceptor-donor structure (D-A-D) may be useful as a near-infrared absorbing electron donor photoactive material or an electron acceptor photoactive material. As another example, a molecule with an acceptor-donor-acceptor structure (A-D-A) may be useful as a near-infrared absorbing electron acceptor photoactive material. Example acceptor groups and donor groups for D-A-D and A-D-A structures are described above. In some cases, the different classes illustrated may exhibit overlapping absorption features (i.e., spectral ranges). It may be desirable, however, to select a counterpart photoactive compound with absorption features from a different spectral region or that do not have overlapping absorption features or that have different peak absorption wavelengths.

The visibly transparent photoactive compounds, useful as photoactive materials, buffer materials, and/or optical layers, include metal dithiolene complexes. In some examples, a photoactive compound exhibits a greater maximum near-infrared absorption strength than maximum visible absorption strength and has a chemical formula

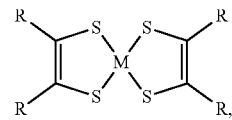

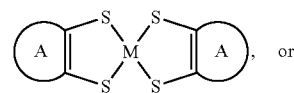

, or

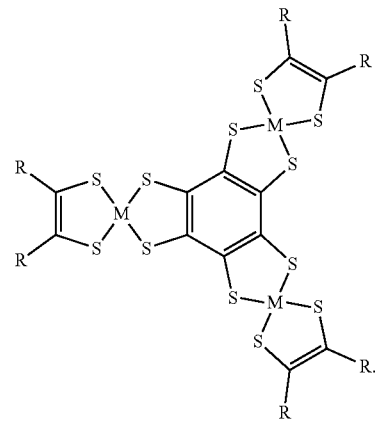

In embodiments, each M is independently a metal, such as Fe, Co, Ni, Cu, Zn, Mo, Pd, or Pt. In embodiments, each R group is independently a hydrogen, a halogen, a cyano group, a substituted or unsubstituted alkyl group, a substituted or unsubstituted alkenyl group, a substituted or unsubstituted aromatic group, a substituted or unsubstituted fused aromatic group, a substituted or unsubstituted heteroaromatic group, a substituted or unsubstituted fused heteroaromatic group, or a substituted or unsubstituted alkoxy group. Optionally, two or more R groups form a substituted or unsubstituted ring group or a substituted or unsubstituted fused ring group. In embodiments, each A is independently a fused polycyclic ring group having one or more R group substituents.

Figure 7A:
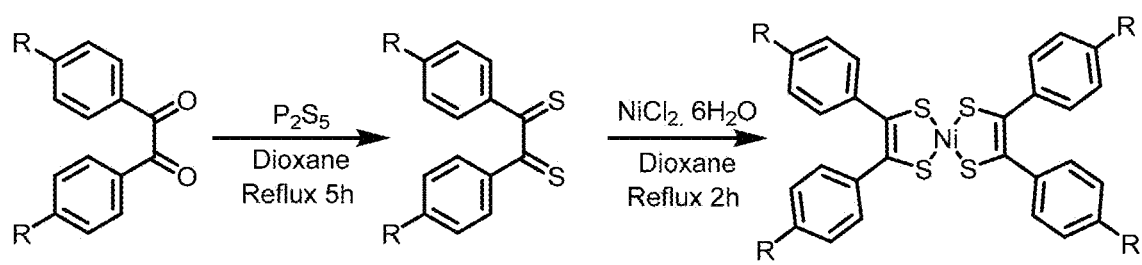
FIG. 7A provides an overview of an example synthetic route for formation of visibly transparent photoactive compounds.
Figure 7B:
FIG. 7B provides an overview of an example synthetic route for formation of visibly transparent photoactive compounds.

FIG. 7A and FIG. 7B provide example synthetic schema for making visibly transparent photoactive compounds. With reference to FIG. 7A, it will be appreciated that many different substitutions may be made for the reactant

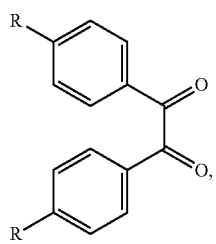

such as to allow substitution of the phenyl ring pendant to the dithione with another structure structures, such as phenyl rings with more or substituents in different positions, or substitution of both phenyl rings with other substituents, such as ring structures fused to the dithione (e.g., ... ), such that the resultant final product is different. Similarly, with reference to FIG. 7B, it will be appreciated that many different substitutions may be made for the cyano groups in order to form a different final products. For example, substitutions may include phenyl rings (e.g., alkyl substituted, halogen substituted, alkoxy substituted, etc.), fused ring structures. Other pendant ring structures may be similarly added, such as naphthyl groups, phenanthryl groups, acenaphthyl groups, etc.

Table 1 provides example metal dithione complexes along with shorthand identifiers (ID).

TABLE 1

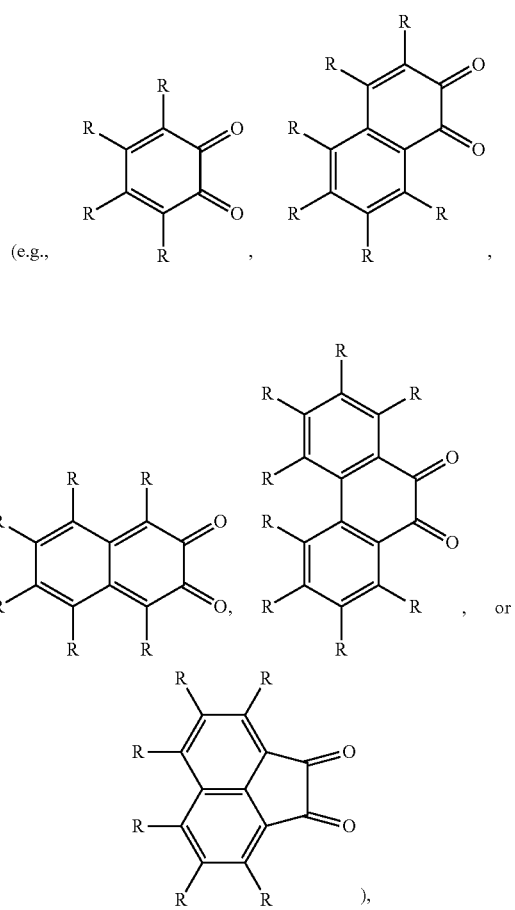

TABLE 1-continued

| ID | Structure |
|---|---|
| D-6 | 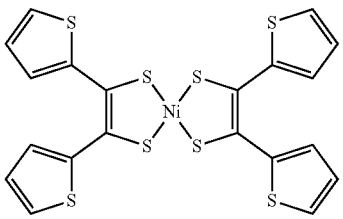 |
| D-7 | 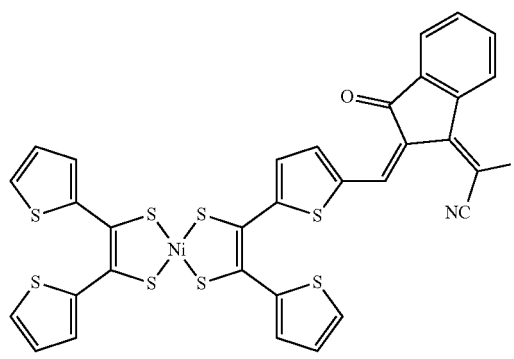 |
| D-8 | 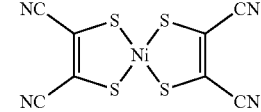 |
| D-9 | 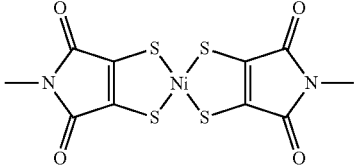 |
| D-10 | 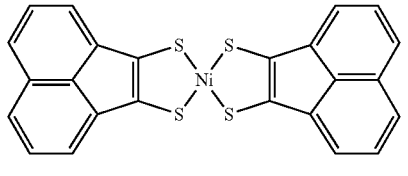 |
| D-11 | 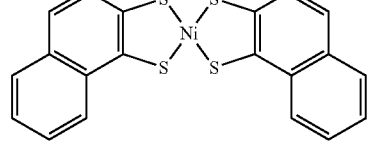 |
| D-12 | 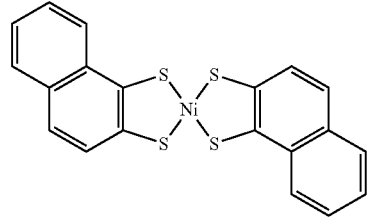 |
| D-13 | 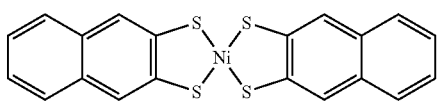 |
| D-14 | 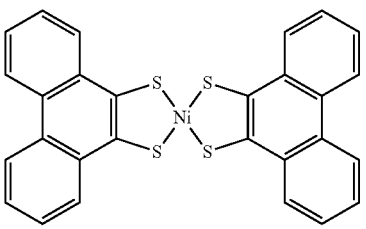 |
| D-15 | 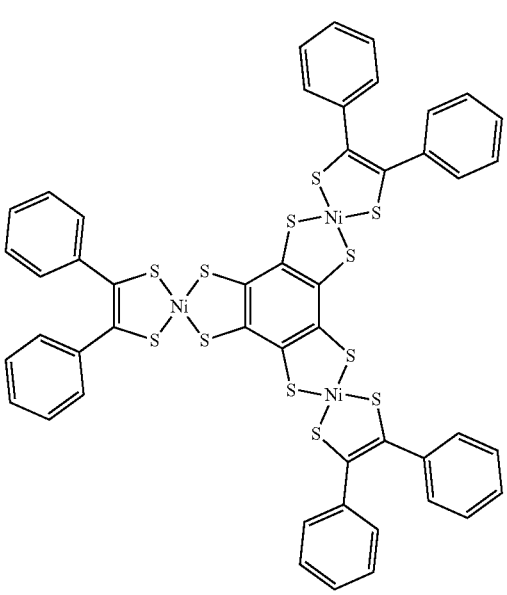 |
| D-16 | 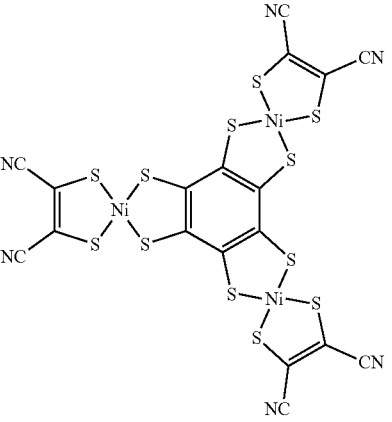 |

Figure 8:
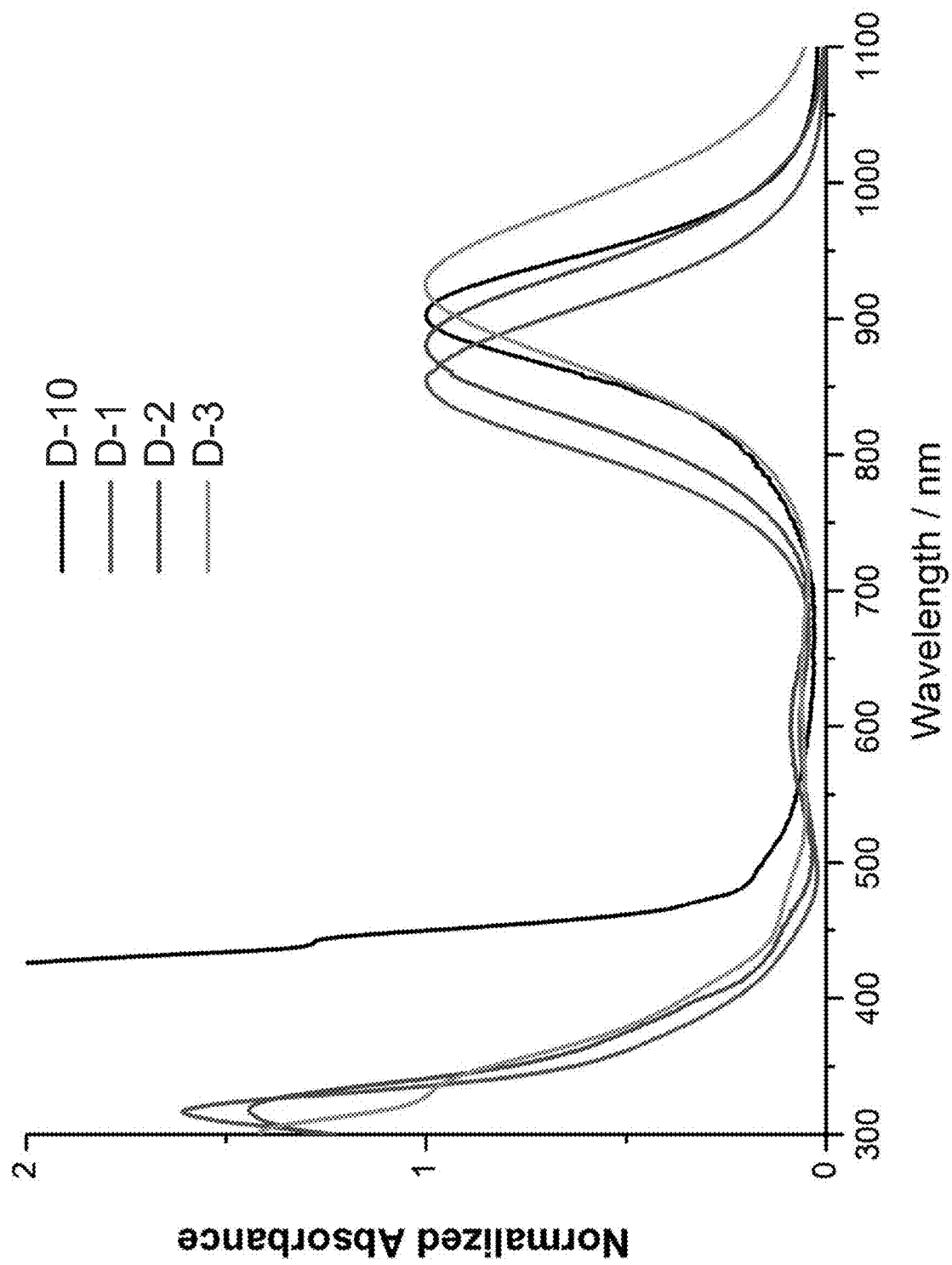
FIG. 8 provides data showing normalized absorbance spectra of different visibly transparent photoactive compounds in solution.

FIG. 8 provides exemplary normalized absorbance spectra for a number of the compounds in Table 1, showing that these compounds exhibit strong absorbance in the near-infrared with some absorbance in the ultraviolet and minimal absorbance in the visible band.

Sample photovoltaic devices were constructed using a number of the transparent photoactive compounds in Table 1 and tested for photovoltaic efficiency. Two device configurations were used for testing purposes, generally constructed as depicted in FIG. 1A, with the transparent photoactive compounds used as a photoactive layer or a buffer layer. In one configuration, two transparent electrodes were used to generate a fully transparent device. In a second configuration, one transparent electrode (indium tin oxide) was used and one opaque electrode was used. Although devices constructed according to the second configuration exhibited opacity due to the presence of the opaque electrode, the device was illuminated through the transparent electrode to examine the photovoltaic behavior.

Figure 9:
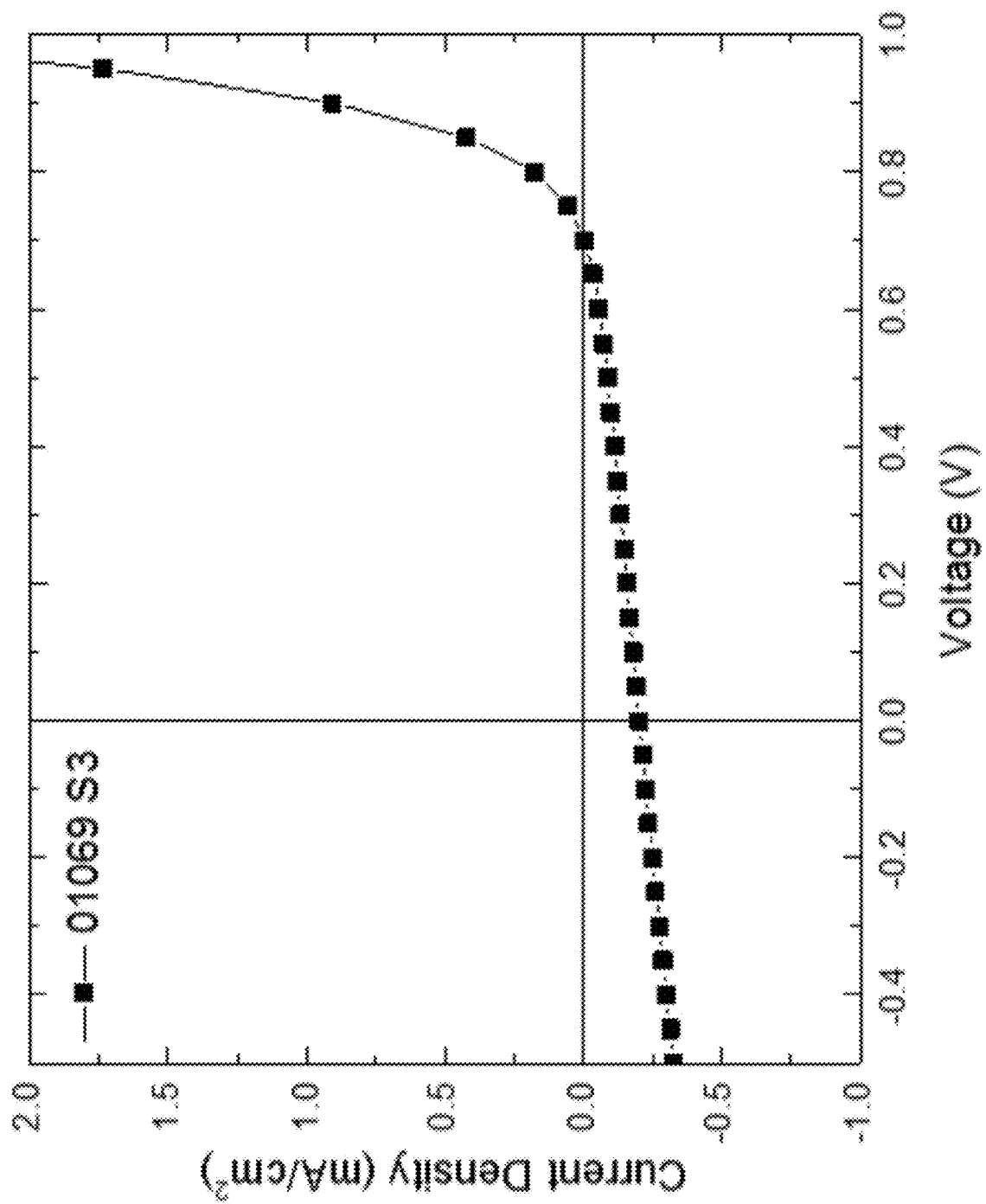
FIG. 9 provides data showing example current density as a function of voltage for an example photovoltaic cell.

As an example, a transparent photovoltaic device using the visibly transparent photoactive compound identified as D-1 with an opaque configuration was constructed as follows. An about 8 nm thick cathode buffer layer was deposited over a visibly transparent substrate and indium tin oxide (ITO) transparent conductor. An about 15 nm thick layer of a subphthalocyanine (SubPc) dye as a donor was deposited over the anode buffer layer. An about 30 nm thick layer of compound D-1 as an acceptor was deposited over the donor layer. An about 5 nm thick cathode buffer layer was deposited over the acceptor layer. Finally, an opaque aluminum layer about 80 nm thick was deposited as a top electrode. The cell was illuminated and performance monitored. FIG. 9 provides example data for the D-10 photovoltaic cell, showing current density as a function of voltage.

Figure 10:
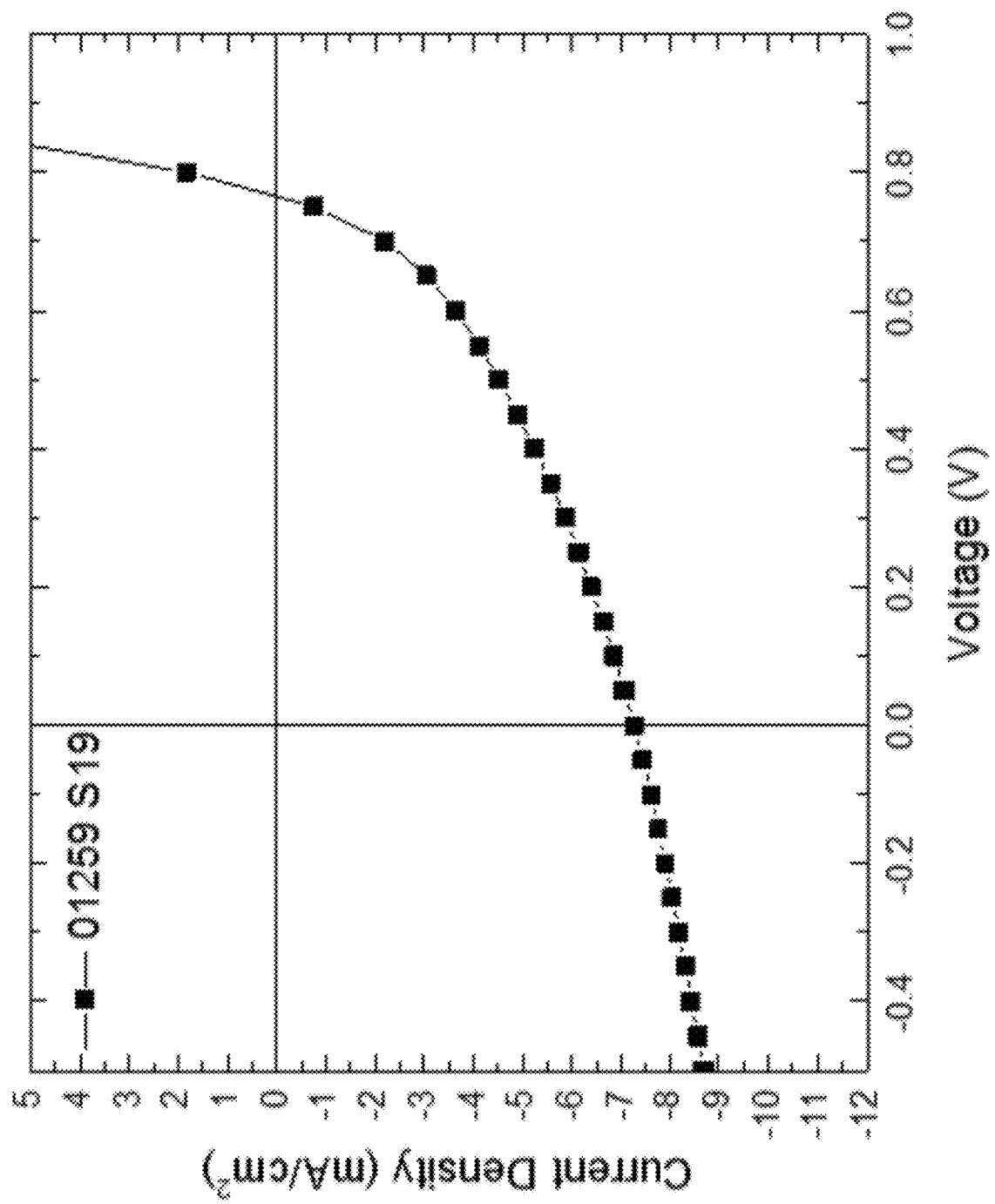
FIG. 10 provides data showing example current density as a function of voltage for an example photovoltaic cell.

Another example transparent photovoltaic device was constructed using a nickel dithiolate complex as a buffer layer in an opaque configuration. An about 10 nm thick cathode buffer layer including compound D-1 was deposited over a visibly transparent substrate and indium tin oxide (ITO) transparent conductor. As the photoactive layer, an about 60 nm thick layer including $C_{60}$ was deposited over the buffer layer. An about 20 nm thick anode buffer layer was deposited over the acceptor layer. Finally, an opaque aluminum layer about 80 nm thick was deposited as a top electrode. The cell was illuminated and performance monitored. FIG. 10 provides example data for the photovoltaic cell, showing current density as a function of voltage.

Metal dithiolates can be used as acceptor materials and paired with a number of useful donor materials. In some embodiments, for example, the acceptor material includes one or more metal dithiolates, and the donor material includes a boron-dipyrromethene (BODIPY) compound, a phthalocyanine, a naphthalocyanine, a dicyano-indandione (DiCN), a benzothiadiazole (BT), a benzo-bis-thiadiazole (BBT), a diketopyrrolopyrrole diphenythienylamine (DPP-DPTA), or a combination thereof. Examples of useful BODIPY compounds include, but are not limited to, those described in U.S. Provisional Pat. Appl. No. 62/521,154 and the U.S. utility application filed on Jun. 15, 2018. Examples of useful DiCNs, BTs, BBTs, and DPP-DPTAs include, but are not limited to, those described in U.S. Provisional Pat. Appl. No. 62/521,224 and the U.S. utility application filed on Jun. 15, 2018. Examples of useful phthalocyanines and naphthalocyanines include, but are not limited to, those described in U.S. Pat. Appl. No. 62/521,214 and the U.S. utility application filed on Jul. 15, 2018. These applications are incorporated herein by reference in their entireties. In some embodiments, the donor material includes a BODIPY compound, a phthalocyanine, a naphthalocyanine, or a combination thereof. In some embodiments, the donor material includes a DiCN, a BT, a BBT, or a DPP-DPTA.

In certain instances, the acceptor material contains a metal dithiolate, and the donor material also contains a metal dithiolate. In such instances, the donor metal dithiolate may be functionalized with one or more donor groups such as the strong, moderate, and weaker donating groups described above. Metal dithiolates functionalized in this manner can also be used as donor materials when paired with an acceptor material such as a BODIPY, a phthalocyanine, a naphthalocyanine, a DiCN, a BT, a BBT, or DPP-DPTA, a naphthalenetetracarboxylic diimide (NTCDI), a bisimide coronene (CBI), a fluoranthene, a corannulene, a fullerene (e.g., C60 or C70), or a combination thereof. Examples of useful NTCDIs, CBIs, fluoranthenes, and corannulenes include, but are not limited to, those described in U.S. Provisional Pat. Appl. No. 62/521,211 and the U.S. utility application filed on Jun. 15, 2018. These applications are incorporated herein by reference in their entireties.

STATEMENTS REGARDING INCORPORATION BY REFERENCE AND VARIATIONS

All references throughout this disclosure, for example patent documents including issued or granted patents or equivalents; patent application publications; and non-patent literature documents or other source material; are hereby incorporated by reference herein in their entireties, as though individually incorporated by reference. For example, U.S. Pat. No. 6,120,692 and University of Rochester, Laboratory for Laser Energetics, LLE Review Quarterly Report, Volume 106, January-March 2006, Chapter 7: Transition Metal Dithiolene Near-IR Dyes and Their Applications in Liquid Crystal Devices, pp. 112-128, are hereby incorporated by reference.

All patents and publications mentioned in this disclosure are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of skill in the art can name the same material differently. It will be appreciated that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered within the scope of this invention as defined by the appended claims.

What is claimed is:

1. A visibly transparent photovoltaic device comprising:
a visibly transparent substrate;
a first visibly transparent electrode coupled to the visibly transparent substrate;
a second visibly transparent electrode above the first visibly transparent electrode;
a first visibly transparent photoactive layer between the first visibly transparent electrode and the second visibly transparent electrode, wherein the first visibly transparent photoactive layer exhibits an average visible band absorption of 70% or less and comprises a first photoactive compound having the formula:

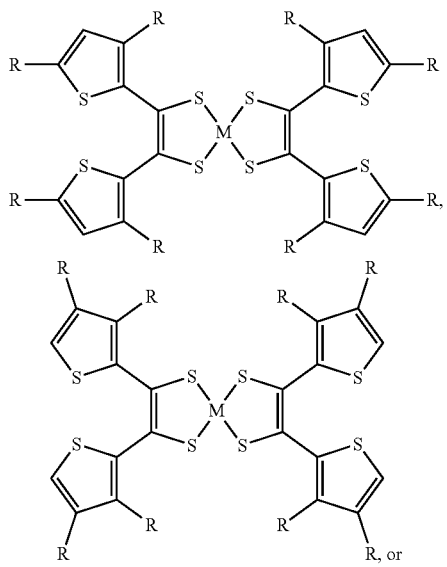

-continued

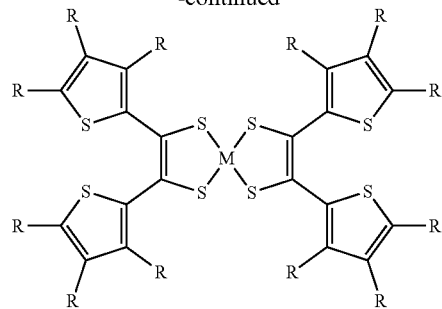

wherein
the first photoactive compound exhibits a first maximum near-infrared absorption strength and a first maximum visible absorption strength, wherein the first maximum near-infrared absorption strength is greater than the first maximum visible absorption strength, and wherein absorption of near-infrared light by the first photoactive compound drives formation and separation of electron-hole pairs,
M is a metal, and
each R group is independently a cyano group, a substituted or unsubstituted alkyl group, a substituted or unsubstituted alkenyl group, a substituted or unsubstituted aromatic group, a substituted or unsubstituted fused aromatic group, a substituted or unsubstituted heteroaromatic group, a substituted or unsubstituted fused heteroaromatic group, or a substituted or unsubstituted alkoxy group, or wherein two or more R groups form a substituted or unsubstituted ring group or a substituted or unsubstituted fused ring group; and
a second visibly transparent photoactive layer between the first visibly transparent electrode and the second visibly transparent electrode and in direct contact with the first visibly transparent photoactive layer, wherein the second visibly transparent photoactive layer exhibits an average visible band absorption of 70% or less and comprises a second photoactive compound exhibiting a second maximum absorption strength in the near-infrared or ultraviolet and a second maximum visible absorption strength, wherein the second maximum absorption strength is greater than the second maximum visible absorption strength, and wherein absorption of near-infrared light or ultraviolet light by the second photoactive compound drives formation and separation of electron-hole pairs, and wherein
the first photoactive compound is an electron donor material for an organic photovoltaic cell and the second photoactive compound is an electron acceptor material for the organic photovoltaic cell, or
the first photoactive compound is an electron acceptor material for the organic photovoltaic cell and the second photoactive compound is an electron donor material for the organic photovoltaic cell.

2. The visibly transparent photovoltaic device of claim 1, wherein each R group is the same.

3. The visibly transparent photovoltaic device of claim 1, wherein the second photoactive compound comprises a boron-dipyrromethene-based compound.

4. The visibly transparent photovoltaic device of claim 1, wherein the second photoactive compound comprises a phthalocyanine or a naphthalocyanine.

5. The visibly transparent photovoltaic device of claim 1, wherein the first visibly transparent photoactive layer and the second visibly transparent photoactive layer independently have thicknesses of 1 nm to 300 nm.

6. The visibly transparent photovoltaic device of claim 1, wherein the first visibly transparent photoactive layer and the second visibly transparent photoactive layer correspond to separate, mixed, or partially mixed layers.

7. The visibly transparent photovoltaic device of claim 1, wherein the first photoactive compound is visibly transparent.

8. The visibly transparent photovoltaic device of claim 1, wherein the first visibly transparent photoactive layer is coupled to the first visibly transparent electrode or wherein the first visibly transparent photoactive layer is coupled to the second visibly transparent electrode.

9. The visibly transparent photovoltaic device of claim 1, wherein M is Fe, Co, Ni, Cu, Zn, Mo, Pd, or Pt.

10. The visibly transparent photovoltaic device of claim 1, wherein one or more R groups are each independently a methoxy group, a cyano group, a thiazolyl group, a phenyl group, a maleimide group, a naphthyl group, or a phenanthrene group.

11. The visibly transparent photovoltaic device of claim 1, wherein absorption of near-infrared light by the first photoactive compound drives formation and separation of electron-hole pairs and wherein absorption of near-infrared light or ultraviolet light by the second photoactive compound drives formation and separation of electron-hole pairs.

12. The visibly transparent photovoltaic device of claim 1, further comprising a visibly transparent buffer layer between the second visibly transparent electrode and the first and second visibly transparent photoactive layers, wherein the visibly transparent buffer layer comprises a sputtered inorganic buffer layer.

13. The visibly transparent photovoltaic device of claim 1, further comprising a visibly transparent buffer layer between the second visibly transparent electrode and the first and second visibly transparent photoactive layers, wherein the visibly transparent buffer layer comprises a sputtered metal oxide buffer layer.

14. The visibly transparent photovoltaic device of claim 1, wherein the second photoactive compound exhibits the second maximum absorption strength in the near-infrared, and wherein first maximum near-infrared absorption strength occurs at a longer wavelength than the second maximum absorption strength in the near-infrared.

15. The visibly transparent photovoltaic device of claim 1, wherein the second photoactive compound exhibits the second maximum absorption strength in the near-infrared, and wherein the first maximum near-infrared absorption strength occurs at a shorter wavelength than the second maximum absorption strength in the near-infrared.

16. The visibly transparent photovoltaic device of claim 1, wherein the first photoactive compound is an electron donor material and the second photoactive compound is an electron acceptor material, wherein the second photoactive compound exhibits the second maximum absorption strength in the near-infrared and is selected from the group consisting of a molecule with an acceptor-donor-acceptor structure (A-D-A), a molecule with a donor-acceptor-donor structure (D-A-D), a QQT compound, a benzo-bis-thiadiazole compound, a dicyano-indandione compound, or a metal dithiolate compound different from the first photoactive compound.

17. The visibly transparent photovoltaic device of claim 1, wherein the first photoactive compound is an electron donor material and the second photoactive compound is an electron acceptor material, wherein the second photoactive compound exhibits the second maximum absorption strength in the ultraviolet and is selected from the group consisting of an indigo compound, a fluoranthene compound, a corranene compound, a corranulene compound, a naphthalenetetracarboxylic diimide compound, or a tetracyanoindacene compound.

18. The visibly transparent photovoltaic device of claim 1, wherein the first photoactive compound is an electron acceptor material and the second photoactive compound is an electron donor material, wherein the second photoactive compound exhibits the second maximum absorption strength in the near-infrared and is selected from the group consisting of a squarine compound, a cyanine salt, a molecule with a donor-acceptor-donor structure (D-A-D), or a metal dithiolate compound different from the first photoactive compound.

19. The visibly transparent photovoltaic device of claim 1, wherein the first photoactive compound is an electron acceptor material and the second photoactive compound is an electron donor material, wherein the second photoactive compound exhibits the second maximum absorption strength in the ultraviolet and is selected from the group consisting of a TAPC compound, an indigo compound, a fluoranthene compound, or corranene compound.

20. The visibly transparent photovoltaic device of claim 1, wherein each R is a halogen, a cyano group, or a substituted or unsubstituted alkenyl group.

21. The visibly transparent photovoltaic device of claim 1, wherein each R is a substituted or unsubstituted aromatic group, a substituted or unsubstituted fused aromatic group, a substituted or unsubstituted heteroaromatic group, or a substituted or unsubstituted fused heteroaromatic group.

* * * * *